(12) United States Patent
Wang et al.

(10) Patent No.: US 11,404,112 B2
(45) Date of Patent: Aug. 2, 2022

(54) LOW-VOLTAGE LOW-POWER MEMORY DEVICE WITH READ, WRITE, HOLD, AND STANDBY ASSIST VOLTAGES AND OPERATION METHOD THEREOF

(71) Applicant: National Chung Cheng University, Chia-Yi (TW)

(72) Inventors: Jinn-Shyan Wang, Chia-yi (TW); Chien-Tung Liu, Changhua County (TW); Hao-Ping Wang, Taichung (TW)

(73) Assignee: NATIONAL CHUNG CHENG UNIVERSITY, Chia-Yi (TW)

( * ) Notice: Subject to any disclaimer, the term of this patent is extended or adjusted under 35 U.S.C. 154(b) by 0 days.

(21) Appl. No.: 17/073,672

(22) Filed: Oct. 19, 2020

(65) Prior Publication Data
US 2022/0036942 A1    Feb. 3, 2022

(30) Foreign Application Priority Data
Jul. 28, 2020 (TW) .................... 109125436

(51) Int. Cl.
*G11C 11/417* (2006.01)
(52) U.S. Cl.
CPC ................... *G11C 11/417* (2013.01)
(58) Field of Classification Search
CPC ...... G11C 11/417; G11C 11/412; G11C 11/41
See application file for complete search history.

(56) References Cited

U.S. PATENT DOCUMENTS

| | | | |
|---|---|---|---|
| 2007/0217262 A1* | 9/2007 | Sachdev | G11C 8/10 365/185.16 |
| 2008/0151604 A1* | 6/2008 | Suzuki | G11C 11/412 365/154 |
| 2010/0214824 A1* | 8/2010 | Chang | G11C 17/12 365/156 |
| 2012/0134219 A1* | 5/2012 | Wang | G11C 11/417 365/189.11 |
| 2013/0021864 A1* | 1/2013 | Deng | G11C 11/417 365/201 |
| 2019/0172526 A1* | 6/2019 | Noel | G11C 11/412 |

* cited by examiner

*Primary Examiner* — Khamdan N. Alrobaie
(74) *Attorney, Agent, or Firm* — Muncy, Geissler, Olds & Lowe P.C.

(57) ABSTRACT

A memory device and an operation method thereof is disclosed. The memory device includes a static random access memory (SRAM) cell, a power-supply assist-voltage generator circuit, a source assist-voltage generator circuit, and a word-line assist-voltage generator circuit. The power-supply assist-voltage generator circuit, the source assist-voltage generator circuit, and the word-line assist-voltage generator circuit lower the effective supply voltage for un-accessed rows of memory cells in the hold mode, increase the effective supply voltage for accessed memory cells in the active mode, and lower the effective supply voltage further for all the SRAM cells in the standby mode to achieve a solution for active and standby power reduction besides achieving the stability and noise margins.

46 Claims, 19 Drawing Sheets

LOW-VOLTAGE LOW-POWER MEMORY DEVICE WITH READ, WRITE, HOLD, AND STANDBY ASSIST VOLTAGES AND OPERATION METHOD THEREOF

This application claims priority of Application No. 109125436 filed in Taiwan on 28 Jul. 2020 under 35 U.S.C. § 119; the entire contents of all of which are hereby incorporated by reference.

BACKGROUND OF THE INVENTION

Field of the Invention

The present invention relates to a memory device, particularly to a memory device and an operation method thereof.

Description of the Related Art

The semiconductor memories, and more particularly the static random access memories (SRAM), are important building components in microelectronic systems, multi-processor chips or system-on-chips (SoC). An SRAM is typically arranged as an array of memory cells. Address decoding allows access to each cell for performing read or write functions. The conventional six-transistor CMOS SRAM cell includes two n-type pull-down (load) transistors (NMOS) and two p-type pull-up (drive) transistors (PMOS) in a cross-coupled inverter configuration, with two additional NMOS pass-gate transistors added to make up a standard double-sided differential memory cell. The traditional six-transistor CMOS SRAM cell is usually abbreviated as a 6T CMOS SRAM cell, a 6T SRAM cell, a 6T bit-cell, a differential 6T cell, or simply a 6T cell.

FIG. 1 is a diagram schematically illustrating a 6T cell 100. As illustrated, the 6T cell 100 comprises a data storage latch. The latch includes a pair of cross-coupled inverters, for example, inverter 112 and inverter 114. FIG. 1 illustrates that the bit is stored in the latch at the first and second latch nodes Q and QB, respectively, having a 'high' or '1' state and a 'low' or '0' state. Cell 100 also comprises a pair of pass transistors 116, 118 to read, and write the data bit between the cross-coupled inverters 112, 114 and bit-lines BL, BLB, when enabled by word-line WL.

Respective inverters 112, 114 comprise a PMOS drive transistor 120, 122, and an NMOS load transistor 124, 126. Pass transistors 116, 118 are NMOS transistors as well. Pass transistors 116, 118 are enabled by word-line WL and accessed by bit-lines BL, BLB to set or reset the SRAM latch. FIG. 1 further illustrates that inverters 112, 114 of the SRAM memory cell 100 have a power-line end 140 provided with a cell power-supply voltage CVDD and a source-line end 150 provided with a cell source voltage CVSS. Both the power-line end 140 and the source-line end 150 are generally provided with fixed voltage levels, such as 0.9 Volts and 0 Volts, respectively. The cell power-supply voltage CVDD may be equal to the system power-supply voltage VDD, and the cell source voltage CVSS may be equal to the system ground voltage VSS. Both the system power-supply voltage and the system ground voltage are global and nominal voltages provided for the entire system in an integrated circuit chip that the SRAM cell is disposed on. Although CVDD may not be the same as VDD and CVSS may not be the same as VSS, we assume in the following descriptions that without loss of generality, CVDD and CVSS are equal to VDD and VSS, respectively.

For performing a read operation, bit-lines BL and BLB are initially pre-charged to a 'high' or '1' state as illustrated. A high voltage is asserted to word-line WL during a read operation to activate (turn-on) pass transistors 116 and 118, whereby latch may be accessed by bit-lines BL and BLB, respectively. The asserted word-line voltage is generally the same as VDD. With the prior data states as shown in FIG. 1, an exemplary high state '1' is on a first latch node Q at the gate of a transistor 126, and a low state '0' is on a second latch node QB at the gate of a transistor 124. With these data states, only transistor 126 on the 'low side' conducts (is on) and via latch node QB, pulls BLB lower, while transistor 124 on the 'high side' does not conduct (is off) and thus, leaves BL high. Thus, given a finite amount of time, the cell will increasingly establish a greater differential voltage between bit-lines BL and BLB which can be sensed by a suitable sensing structure.

A high voltage generally being the same as VDD is also asserted to word-line WL during a write operation, whereby the bit stored in the latch at the first and second latch nodes Q and QB will be updated according to the new data sent in advance to BL and BLB.

If WL is not asserted, the SRAM is in a hold mode, preserving the data and dissipating leakage power consumption only. Many memory cells are usually needed in practical applications, and they are configured as an array, to be described later. When a cell wants to hold the prior data but is placed in the same row with an accessed cell in a read or write mode, it is in a hold mode with a read-half-select concern because its word-line is also asserted while bit-lines are in the pre-charge state. We call such a cell a half-select (HS) cell, and specifically a read-half-select (rHS) cell suffering from a rHS disturb. When a cell wants to hold the stored data and is placed in the same column with an accessed cell in a read mode, this cell is in a hold mode but with a write-half-select concern because its word-line is not asserted but a greater differential voltage will be developed between bit-lines due to the read operation. This is also a HS cell, and specifically a write-half-select (wHS) cell suffering from a wHS disturb. When a cell wants to hold the stored data and is placed in the same column with an accessed cell in a write mode, this cell is also in a hold mode with a write-half-select concern because its word-line is not asserted but the new data are sent in advance to bit-lines. Such a cell is also a wHS cell suffering from a wHS disturb. For a conventional 6T cell, the wHS effect is usually less severe than the rHS effect. When a cell wants to hold the stored data and is placed neither in the same row nor in the same column with an accessed cell no matter in a read or write mode, this cell is in a hold mode without any concerns because not only is its word-line not asserted but also are its bit-lines in the pre-charge state.

If all the SRAM cells in a memory device are not accessed for a long time, they are said in a standby mode, and can even enter a power-down (sleep) operation mode for reducing the leakage power consumption. We use a standby mode and a power-down mode interchangeably herein. Note that there can be various sleep depths to achieve various degree of power saving. For example, there may be a deep power-down mode or a shallow power-down mode.

In general, SRAM cells are stable and have good data retention where the respective transistors 120, 122 and transistors 124, 126 are balanced and matched within the two inverters 112, 114. However, as dimensions are reduced to scale down devices, it becomes increasingly difficult to achieve a balance in the relative strengths (e.g. drive current capability) of the pass gate, drive, and load transistors over the desired range of temperature, bias conditions, and process variations, as well as achieving matched transistor characteristics. As a result, SRAM cells formed as such can be adversely affected by varying operating characteristics, may be unstable, and may not be able to update the desired bit state during the write operation or retain the desired bit state during read, hold, and standby modes.

SRAM blocks and SRAM-based caches are major power-consuming components in the SoC and multi-processor chips. Besides the large active power dissipated in read and write operations, the leakage current in a memory array comprising multiple SRAM cells can also be large enough to result in an unacceptable level of power consumption in hold or standby modes. High power consumption shortens the life time of battery-powered devices, and reducing active and leakage power consumption has become a vital design goal for the on-chip SRAM device.

Lowering VDD in the active (read or write) operations is a useful design method to reduce the power consumption of the memory devices. However, an over-lowered power-supply voltage deteriorates the read stability, the write margin, and the hold/standby noise margin. Various new memory bit-cells are developed to increase noise margins for the design of low-voltage low-power SRAM devices. For example, some methods improve the stability of a read or rHS cell by using the read decoupled (RD) scheme with one or two additional transistors as a separated read port to decouple the read path from the cell storage nodes of the 6T cell. This scheme successfully increases the read static noise margin (RSNM) and suppresses the read and rHS disturbs, however at the expense of an additional layout area due to the increase of transistor counts. Moreover, the RD scheme does not solve the rHS-disturb issue in write operations.

In order to maintain a compact cell area, many assist schemes were developed for the 6T cell. FIG. 2 shows the concepts of these assist schemes. For example, some methods use the word-line (WL) voltage underdrive (WLUD) scheme to improve the rHS/RSNM during read/write cycles by applying a WL voltage less than VDD by an amount of ΔVDD. However, the WLUD scheme tends to degrade the cell read current ($I_{CELL}$) and results in slower read speed. Moreover, the weaker strength of the pass transistors in the memory cell degrades the write margin (WM), and necessitates an increase in the strength of other write-assist circuitry 200. However, the increase in the strength of other write-assist circuitry may result in an over-strength write-assist so as to hurt the hold static noise margin (HSNM) of inactive cells on the selected columns or to induce large area and power overhead.

There are many assist schemes proposed to improve the WM of the 6T cell. Some methods use the WL boosting (WLB) scheme for increasing the pull-down (PD) strength. However, the WLB scheme degrades the read stability for HS cells on the activated row. Some other methods use the cell-VDD lowering (CVDDL) scheme to weaken the pull-up PMOS (PU). However, the CVDDL scheme sacrifices the hold static noise margin (HSNM) of inactive cells on the selected columns. Other methods use the negative-bit-line (NBL) scheme for increasing the pull-down NMOS (PD) strength. However, the NBL scheme consumes significant area and power due to the inclusion of pumping capacitors. Moreover, the NBL scheme should be used cautiously not to degrade the stability of un-accessed cells on the select columns due to a weak turn-on of the pass transistors in a 6T cell.

Above assist schemes are used for a differential 6T cell. The traditional 6T cell can be treated as a dual-split-control (DSC) 6T cell, as shown in FIG. 3, with split first and second word lines WL1 and WL2 for controlling the individual pass gate and with split cell-VSS (CVSS) lines connecting to the individual inverter of the latch. The DSC 6T cell uses split-controlled CVSS boosting scheme (sCVSSB) to improve rHS cell stability during the read and write cycles without degrading $I_{CELL}$ and WM, and uses the NBL scheme in addition to the sCVSSB scheme during write cycles. Note that the generation circuit of sCVSSB may have high area overhead, and the NBL scheme consumes significant area and power overhead.

Usually, different designs focus on adopting different combinations of different read- and write-assist circuits, while leakage current reduction is majorly treated as a stand-alone design for long-standby applications. For leakage reduction in the standby or power-down mode, the source biasing scheme (SB) is usually adopted by raising the CVSS to introduce a negative body bias to the NMOS devices of the latch in the differential 6T cell. There is a prior-art method using the CVDDL scheme for both write and power-down assist. The amount of cell-VDD lowering required for write assist is not the same with that required for power-down assist.

In view of the challenges in the state of the art, the present invention relates to the design of a low-voltage low-power SRAM device, To overcome the abovementioned problems, the present invention provides a memory device and an operation method.

SUMMARY OF THE INVENTION

The present invention provides a memory device and an operation method thereof, which use the read-, write-, hold-, and standby-assist as a whole for increasing the read stability, increase the write margin, maintaining the hold margin, reduce the hold and standby leakage current, and/or increase the operating speed at the same time. Embodiments of the present invention lower the effective supply voltage for un-accessed rows of memory cells in the hold mode, increase the effective supply voltage for accessed memory cells in the active mode, and lower the effective supply voltage further for all the SRAM cells in the standby mode to achieve a solution for whole-time (active and standby) power reduction besides achieving the stability and noise margins. The effective supply voltage is defined as the voltage difference between the local power-supply voltage and the local source voltage of the memory cell.

In an embodiment of the present invention, a memory device includes a first transistor, a second transistor, a static random access memory cell, a power-supply assist-voltage generator circuit, a source assist-voltage generator circuit, and a word-line assist-voltage generator circuit. The first transistor is configured to receive a system power supply voltage. The second transistor is configured to receive a system ground voltage. The static random access memory cell, coupled to the first transistor and the second transistor, has a first local power supply assist voltage node, a second local power supply assist voltage node, a third local power supply assist voltage node, a first local source assist voltage node, a second local source assist voltage node, a third local source assist voltage node, a fourth local source assist voltage node, a first local word-line assist voltage node, and a second local word-line assist voltage node. The first local power supply assist voltage node, the second local power supply assist voltage node, and the third local power supply assist voltage node are configured to receive the system power supply voltage, a first power supply assist voltage, or a second power supply assist voltage. The first power supply assist voltage and the second power supply assist voltage are substantially less than the system power supply voltage and higher than the system ground voltage. The first local source assist voltage node, the second local source assist voltage node, the third local source assist voltage node, the fourth local source assist voltage node are configured to receive the system ground voltage, a first source assist voltage, or a second source assist voltage. The first source assist voltage and the second source assist voltage are substantially higher than the system ground voltage and less than the system power supply voltage. The first local word-line assist voltage node and the second local word-line assist voltage node are configured to receive the system ground voltage, a first word-line assist voltage, or a second word-line assist voltage. The first word-line assist voltage is substantially equal to the system power supply voltage. The second word-line assist voltage is substantially higher than the system ground voltage and less than the system power supply voltage. The power-supply assist-voltage generator circuit is coupled to the first local power supply assist voltage node, the second local power supply assist voltage node, and the third local power supply assist voltage node. The power-supply assist-voltage generator circuit is configured to receive a standby control signal and a write-mode or deep sleep control signal. The power-supply assist-voltage generator circuit is configured to generate the second power supply assist voltage at the first local power supply assist voltage node, the second local power supply assist voltage node, and the third local power supply assist voltage node in response to the write-mode or deep sleep control signal in a write mode or deep sleep mode. The power-supply assist-voltage generator circuit is configured to generate the system power supply voltage at the first local power supply assist voltage node in a read mode or a hold mode. The power-supply assist-voltage generator circuit is configured to generate the system power supply voltage at the second local power supply assist voltage node and the third local power supply assist voltage node in response to the standby control signal and the write-mode or deep sleep control signal in a read mode or a hold mode. The source assist-voltage generator circuit is coupled to the first local source assist voltage node, the second local source assist voltage node, the third local source assist voltage node, and the fourth local source assist voltage node. The source assist-voltage generator circuit is configured to receive the standby control signal, a first hold-mode control signal, and a second hold-mode control signal. The source assist-voltage generator circuit is configured to generate the first source assist voltage at the first local source assist voltage node, the second local source assist voltage node, the third local source assist voltage node, and the fourth local source assist voltage node in response to the standby control signal in a standby mode. The source assist-voltage generator circuit is configured to generate the second source assist voltage at the first local source assist voltage node and the third local source assist voltage node in response to the first hold-mode control signal in a hold mode. The source assist-voltage generator circuit is configured to generate the second source assist voltage at the second local source assist voltage node and the fourth local source assist voltage node in response to the second hold-mode control signal in a hold mode. The source assist-voltage generator circuit is configured to generate the system ground voltage at the first local source assist voltage node and the second local source assist voltage node in a read or write mode. The source assist-voltage generator circuit is configured to generate the system ground voltage at the third local source assist voltage node in response to the standby control signal and the first hold-mode control signal in a read or write mode. The source assist-voltage generator circuit is configured to generate the system ground voltage at the fourth local source assist voltage node in response to the standby control signal and the second hold-mode control signal in a read or write mode. The word-line assist-voltage generator circuit is coupled to the first local word-line assist voltage node and the second local word-line assist voltage node. The word-line assist-voltage generator circuit is configured to receive a word-line underdrive control signal, a first decoded word-line signal, and a second decoded word-line signal. The word-line assist-voltage generator circuit is configured to generate the first word-line assist voltage at the second local word-line assist voltage node in response to the word-line underdrive control signal or generate the second word-line assist voltage at the second local word-line assist voltage node in response to the second decoded word-line signal in a write mode. The word-line assist-voltage generator circuit is configured to generate the system ground voltage at the first local word-line assist voltage node in response to the word-line underdrive control signal and the first decoded word-line signal in a hold mode or a standby mode. The word-line assist-voltage generator circuit is configured to generate the system ground voltage at the second local word-line assist voltage node in response to the word-line underdrive control signal and the second decoded word-line signal in a hold mode or a standby mode.

In an embodiment of the present invention, the power-supply assist-voltage generator circuit is configured to generate the system power supply voltage at the first local power supply assist voltage node in response to the standby control signal and the write-mode or deep sleep control signal.

In an embodiment of the present invention, the source assist-voltage generator circuit is configured to generate the system ground voltage at the first local source assist voltage node in response to the standby control signal and the first hold-mode control signal. The source assist-voltage generator circuit is configured to generate the system ground voltage at the second local source assist voltage node in response to the standby control signal and the second hold-mode control signal.

In an embodiment of the present invention, the power-supply assist-voltage generator circuit is configured to generate the first power supply assist voltage at the first local power supply assist voltage node, the second local power supply assist voltage node, and the third local power supply assist voltage node in response to the standby control signal in a standby mode.

In an embodiment of the present invention, the power-supply assist-voltage generator circuit is configured to generate the system power supply voltage at the first local power supply assist voltage node in a standby mode. The power-supply assist-voltage generator circuit is configured to generate the system power supply voltage at the second local power supply assist voltage node and the third local power supply assist voltage node in response to the standby control signal and the write-mode or deep sleep control signal in a standby mode.

In an embodiment of the present invention, the power-supply assist-voltage generator circuit is configured to generate the system power supply voltage at the first local power supply assist voltage node in response to the standby control signal and the write-mode or deep sleep control signal.

In an embodiment of the present invention, the static random access memory cell is a double-sided differential 6T memory cell or a generic split-control (GSC) 6T memory cell. The differential 6T memory cell has one power-supply line, one source-voltage line, one word line, and a pair of differential bit lines. The GSC 6T memory cell has three split-controlled power-supply lines, four split-controlled source voltage lines, two split-controlled word lines, and two split-accessed bit lines.

In an embodiment of the present invention, the first local power supply assist voltage node includes bases of two pull-up P-channel metal-oxide-semiconductor field effect transistors of the static random access memory cell. The second local power supply assist voltage node and the third local power supply assist voltage node are respectively sources of the pull-up P-channel metal-oxide-semiconductor field effect transistors.

In an embodiment of the present invention, the first local source assist voltage node and the second local source assist voltage node are respectively bases of two pull-down N-channel metal-oxide-semiconductor field effect transistors of the static random access memory cell. The third local source assist voltage node includes sources of the two pull-down N-channel metal-oxide-semiconductor field effect transistors.

In an embodiment of the present invention, the first local power supply assist voltage node is maintained to receive the system power supply voltage, the second local power supply assist voltage node and third local power supply assist voltage node are coupled to each other. The second local power supply assist voltage node and third local power supply assist voltage node are configured to receive system power supply voltage, the first power supply assist voltage, or the second power supply assist voltage.

In an embodiment of the present invention, the first local power supply assist voltage node, the second local power supply assist voltage node, and the third local power supply assist voltage node are coupled to each other and configured to receive the system power supply voltage, the first power supply assist voltage, or the second power supply assist voltage.

In an embodiment of the present invention, the first local source assist voltage node and the second local source assist voltage node are maintained to receive the system ground voltage. The third local source assist voltage node and the fourth local source assist voltage node are configured to receive the system ground voltage, the first source assist voltage, or the second source assist voltage.

In an embodiment of the present invention, the static random access memory cell is formed in a deep N-type well. The first local source assist voltage node and the third local source assist voltage node are coupled to each other and configured to receive the system ground voltage, the first source assist voltage, or the second source assist voltage. The second local source assist voltage node and the fourth local source assist voltage node are coupled to each other and configured to receive the system ground voltage, the first source assist voltage, or the second source assist voltage.

In an embodiment of the present invention, the source assist-voltage generator circuit includes a first assist voltage generation sub-circuit and a second assist voltage generation sub-circuit. The first assist voltage generation sub-circuit is coupled to the first local source assist voltage node and the third local source assist voltage node. The first assist voltage generation sub-circuit provides assist voltage for the first local source assist voltage node and the third local source assist voltage node. The second assist voltage generation sub-circuit is coupled to the second local source assist voltage node and the fourth local source assist voltage node. The second assist voltage generation sub-circuit provides assist voltage for the second local source assist voltage node and the fourth local source assist voltage node.

In an embodiment of the present invention, the word-line assist-voltage generator circuit includes a first word-line assist-voltage generation sub-circuit and a second word-line assist-voltage generation sub-circuit. The first word-line assist-voltage generation sub-circuit is coupled to the first local word-line assist voltage node. The first word-line assist-voltage generation sub-circuit provides assist voltage for the first local word-line assist voltage node. The second word-line assist-voltage generation sub-circuit is coupled to the second local word-line assist voltage node. The second word-line assist-voltage generation sub-circuit provides assist voltage for the second local word-line assist voltage node.

In an embodiment of the present invention, the power-supply assist-voltage generator circuit provides a resistive path when receiving the standby control signal and the write-mode or deep sleep control signal.

In an embodiment of the present invention, the source assist-voltage generator circuit provides a resistive path when receiving the standby control signal, the first hold-mode control signal, and the second hold-mode control signal.

In an embodiment of the present invention, the word-line assist-voltage generator circuit provides a resistive path when receiving the word-line underdrive control signal, the first decoded word-line signal, and the second decoded word-line signal.

In an embodiment of the present invention, the power-supply assist-voltage generator circuit includes one or more transistors configured to provide resistive paths to a ground voltage.

In an embodiment of the present invention, the source assist-voltage generator circuit includes one or more transistors configured to provide resistive paths to a ground voltage.

In an embodiment of the present invention, the word-line assist-voltage generator circuit includes one or more transistors configured to provide resistive paths to a ground voltage.

In an embodiment of the present invention, the static random access memory cell is disposed in an integrated circuit chip, and the power-supply assist-voltage generator circuit, the source assist-voltage generator circuit, and the word-line assist-voltage generator circuit are disposed externally to the integrated circuit chip.

In an embodiment of the present invention, an operation method applied to the memory device including: receiving the system power supply voltage; receiving the system ground voltage; receiving the standby control signal and the write-mode or deep sleep control signal, and generating the second power supply assist voltage at the first local power supply assist voltage node, the second local power supply assist voltage node, and the third local power supply assist voltage node in response to the write-mode or deep sleep control signal in a write mode or deep sleep mode; generating the system power supply voltage at the first local power supply assist voltage node in a read mode or a hold mode, and generating the system power supply voltage at the second local power supply assist voltage node and the third local power supply assist voltage node in response to the standby control signal and the write-mode or deep sleep control signal in a read mode or a hold mode; receiving the standby control signal, a first hold-mode control signal, and a second hold-mode control signal, and generating the first source assist voltage at the first local source assist voltage node, the second local source assist voltage node, the third local source assist voltage node, and the fourth local source assist voltage node in response to the standby control signal in a standby mode; generating the second source assist voltage at the first local source assist voltage node and the third local source assist voltage node in response to the first hold-mode control signal in a hold mode, and generating the second source assist voltage at the second local source assist voltage node and the fourth local source assist voltage node in response to the second hold-mode control signal in a hold mode; generating the system ground voltage at the first local source assist voltage node and the second local source assist voltage node in a read or write mode, generating the system ground voltage at the third local source assist voltage node in response to the standby control signal and the first hold-mode control signal in a read or write mode, and generating the system ground voltage at the fourth local source assist voltage node in response to the standby control signal and the second hold-mode control signal in a read or write mode; receiving the word-line underdrive control signal, the first decoded word-line signal, and the second decoded word-line signal, and either generating the first word-line assist voltage at the first local word-line assist voltage node in response to the word-line underdrive control signal or generating the second word-line assist voltage at the first local word-line assist voltage node in response to the first decoded word-line signal in a write mode; generating the first word-line assist voltage at the second local word-line assist voltage node in response to the word-line underdrive control signal or generate the second word-line assist voltage at the second local word-line assist voltage node in response to the second decoded word-line signal in a write mode; and generating the system ground voltage at the first local word-line assist voltage node in response to the word-line underdrive control signal and the first decoded word-line signal in a hold mode or a standby mode, and generating the system ground voltage at the second local word-line assist voltage node in response to the word-line underdrive control signal and the second decoded word-line signal in a hold mode or a standby mode.

In an embodiment of the present invention, a memory device includes a first transistor, a second transistor, a memory array, a power-supply assist-voltage generator circuit, a source assist-voltage generator circuit, and a word-line assist-voltage generator circuit. The first transistor is configured to receive a system power supply voltage. The second transistor is configured to receive a system ground voltage. The memory array, coupled to the first transistor and the second transistor, includes static random access memory cells. The static random access memory cell has a first local power supply assist voltage node, a second local power supply assist voltage node, a third local power supply assist voltage node, a first local source assist voltage node, a second local source assist voltage node, a third local source assist voltage node, a fourth local source assist voltage node, a first local word-line assist voltage node, and a second local word-line assist voltage node. The first local power supply assist voltage node, the second local power supply assist voltage node, and the third local power supply assist voltage node are configured to receive the system power supply voltage, a first power supply assist voltage, or a second power supply assist voltage. The first power supply assist voltage and the second power supply assist voltage are substantially less than the system power supply voltage and higher than the system ground voltage. The first local source assist voltage node, the second local source assist voltage node, the third local source assist voltage node, the fourth local source assist voltage node are configured to receive the system ground voltage, a first source assist voltage, or a second source assist voltage. The first source assist voltage and the second source assist voltage are substantially higher than the system ground voltage and less than the system power supply voltage. The first local word-line assist voltage node and the second local word-line assist voltage node are configured to receive the system ground voltage, a first word-line assist voltage, or a second word-line assist voltage. The first word-line assist voltage is substantially equal to the system power supply voltage. The second word-line assist voltage is substantially higher than the system ground voltage and less than the system power supply voltage. The power-supply assist-voltage generator circuit is coupled to the first local power supply assist voltage node, the second local power supply assist voltage node, and the third local power supply assist voltage node. The power-supply assist-voltage generator circuit is configured to receive a standby control signal and a write-mode or deep sleep control signal. The power-supply assist-voltage generator circuit is configured to generate the second power supply assist voltage at the first local power supply assist voltage node, the second local power supply assist voltage node, and the third local power supply assist voltage node in response to the write-mode or deep sleep control signal in a write mode or deep sleep mode. The power-supply assist-voltage generator circuit is configured to generate the system power supply voltage at the first local power supply assist voltage node in a read mode or a hold mode. The power-supply assist-voltage generator circuit is configured to generate the system power supply voltage at the second local power supply assist voltage node and the third local power supply assist voltage node in response to the standby control signal and the write-mode or deep sleep control signal in a read mode or a hold mode. The source assist-voltage generator circuit is coupled to the first local source assist voltage node, the second local source assist voltage node, the third local source assist voltage node, and the fourth local source assist voltage node. The source assist-voltage generator circuit is configured to receive the standby control signal, a first hold-mode control signal, and a second hold-mode control signal. The source assist-voltage generator circuit is configured to generate the first source assist voltage at the first local source assist voltage node, the second local source assist voltage node, the third local source assist voltage node, and the fourth local source assist voltage node in response to the standby control signal in a standby mode. The source assist-voltage generator circuit is configured to generate the second source assist voltage at the first local source assist voltage node and the third local source assist voltage node in response to the first hold-mode control signal in a hold mode. The source assist-voltage generator circuit is configured to generate the second source assist voltage at the second local source assist voltage node and the fourth local source assist voltage node in response to the second hold-mode control signal in a hold mode. The source assist-voltage generator circuit is configured to generate the system ground voltage at the first local source assist voltage node and the second local source assist voltage node in a read or write mode. The source assist-voltage generator circuit is configured to generate the system ground voltage at the third local source assist voltage node in response to the standby control signal and the first hold-mode control signal in a read or write mode. The source assist-voltage generator circuit is configured to generate the system ground voltage at the fourth local source assist voltage node in response to the standby control signal and the second hold-mode control signal in a read or write mode. The word-line assist-voltage generator circuit is coupled to the first local word-line assist voltage node and the second local word-line assist voltage node. The word-line assist-voltage generator circuit is configured to receive a word-line underdrive control signal, a first decoded word-line signal, and a second decoded word-line signal. The word-line assist-voltage generator circuit is configured to generate the first word-line assist voltage at the second local word-line assist voltage node in response to the word-line underdrive control signal or generate the second word-line assist voltage at the second local word-line assist voltage node in response to the second decoded word-line signal in a write mode. The word-line assist-voltage generator circuit is configured to generate the system ground voltage at the first local word-line assist voltage node in response to the word-line underdrive control signal and the first decoded word-line signal in a hold mode or a standby mode. The word-line assist-voltage generator circuit is configured to generate the system ground voltage at the second local word-line assist voltage node in response to the word-line underdrive control signal and the second decoded word-line signal in a hold mode or a standby mode.

Below, the embodiments are described in detail in cooperation with the drawings to make easily understood the technical contents, characteristics and accomplishments of the present invention.

DETAILED DESCRIPTION OF THE INVENTION

Figure 1:
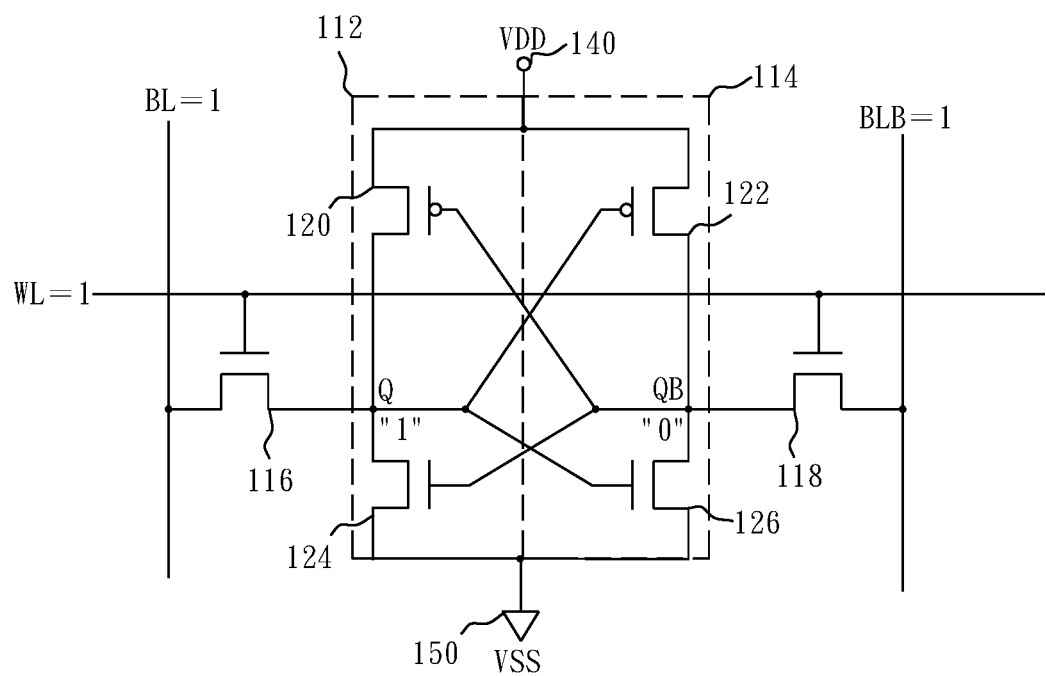
FIG. 1 is a diagram schematically illustrating a conventional 6T cell.
Figure 2:
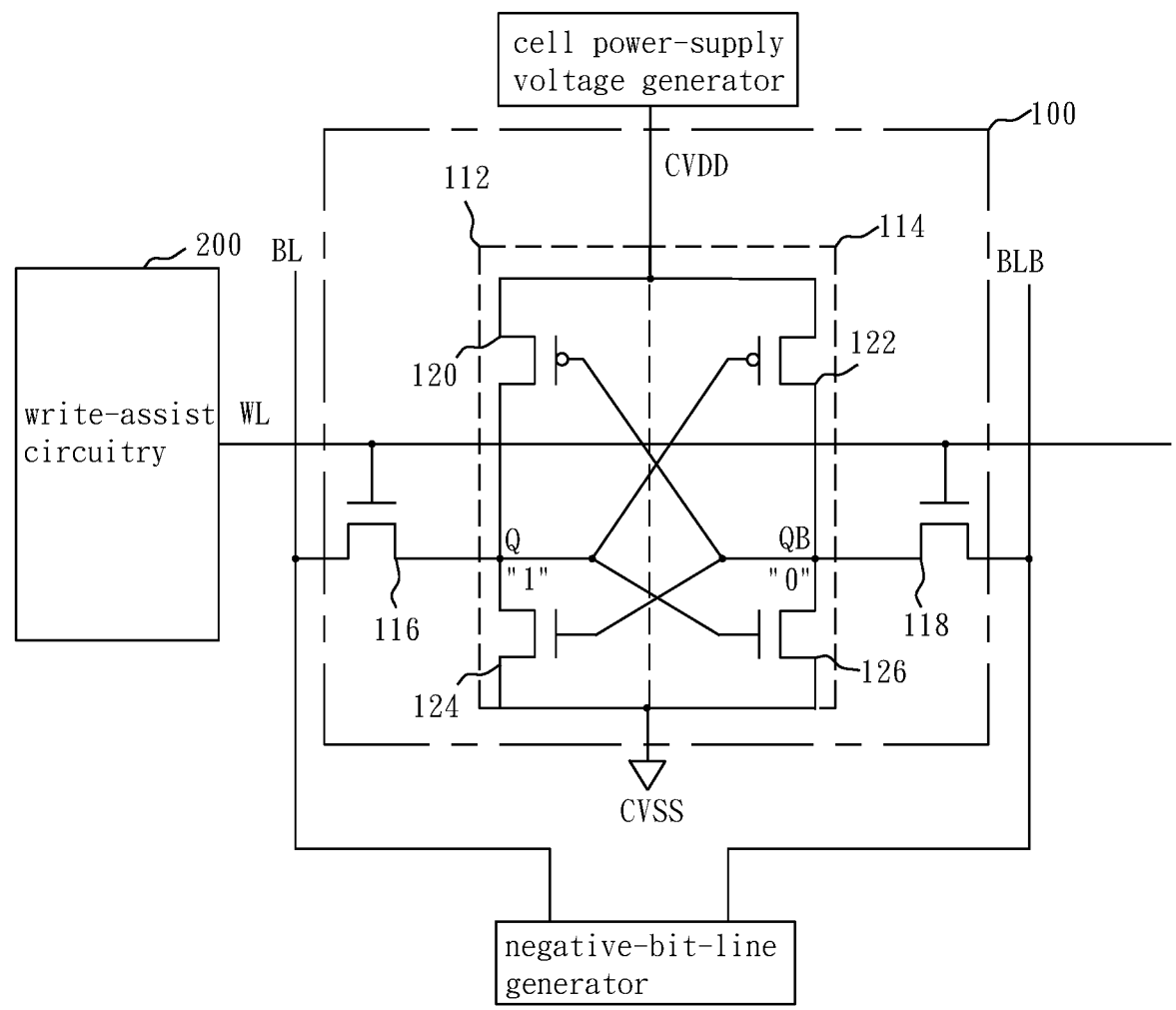
FIG. 2 is a diagram schematically illustrating a conventional 6T cell connected to write-assist circuitry.
Figure 3:
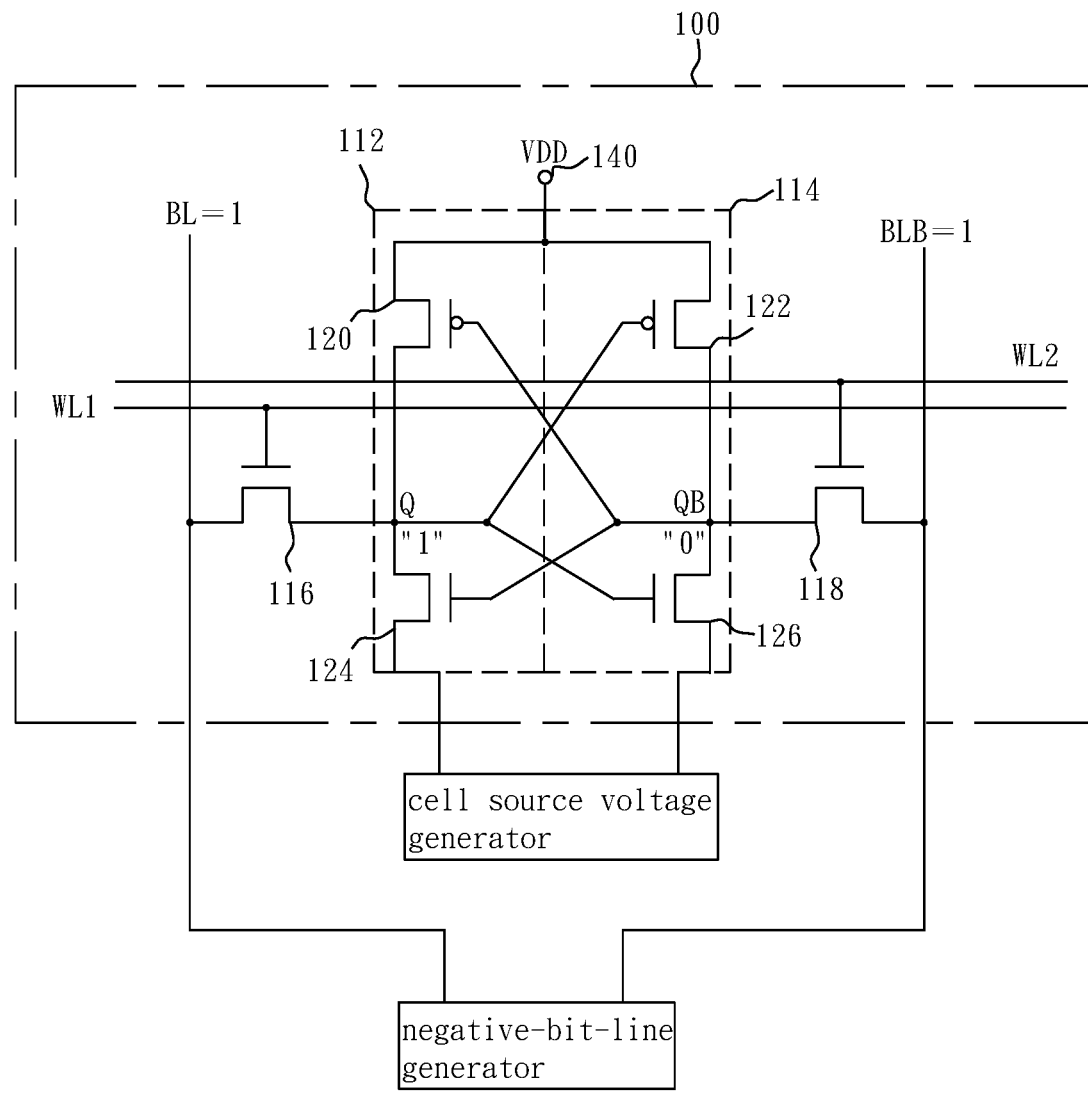
FIG. 3 is a diagram schematically illustrating a conventional dual-split-control (DSC) 6T cell.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The description may use the phrases "in an embodiment," "in embodiments," or "in various embodiments, which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)", that is, A is an optional element.

The terms chip, die, integrated circuit, monolithic device, semiconductor device, and microelectronic device are often used interchangeably in the microelectronics field. The present invention is applicable to all of the above as they are generally understood in the field.

In view of the challenges in the state of the art, the present invention relates to the design of a low-voltage low-power SRAM device, using the read-, write-, hold-, and standby-assist as a whole for increasing the read stability, increasing the write margin, maintaining the hold margin, reducing the hold and standby leakage current, and/or increasing the operating speed at the same time. Embodiments of the present invention are directed to methods and apparatuses for read-, write-, hold-, and standby-assist voltage generation for static random access memory (SRAM) cells. Embodiments of the present invention lower the effective supply voltage for un-accessed rows of memory cells in the hold mode, increase the effective supply voltage for accessed memory cells in the active mode, and lower the effective supply voltage further for all the SRAM cells in the standby mode to achieve a solution for whole-time (active and standby) power reduction besides achieving the stability and noise margins. The effective supply voltage is defined as the voltage difference between the local power-supply voltage and the local source voltage of the memory cell.

For embodiments wherein the SRAM cell receives read-, write-, hold-, and standby-assist voltages, the SRAM cell can be a conventional differential 6T cell with one power-supply line, one source-voltage line, one word-line, and a pair of differential bit-lines, or a generic split-control (GSC) 6T cell with three split-controlled power-supply lines, four split-controlled source-voltage lines, two split-controlled word-lines, and two split-accessed bit-lines.

According to various embodiments, an SRAM cell may include a first local power-supply assist-voltage node for receiving a power-supply assist-voltage VDDa, a second local power-supply assist-voltage node for receiving a power-supply assist-voltage VDDa1, and a third local power-supply assist-voltage node for receiving a power-supply assist-voltage VDDa2 with VDDa, VDDa1, and VDDa2 generated by a power-supply assist-voltage generator circuit (VDDAG) coupled to the first local power-supply assist-voltage node, the second local power-supply assist-voltage node, and the third local power-supply assist-voltage node, and include a first local source assist-voltage node for receiving a source assist-voltage VSSaa, a second local source assist-voltage node for receiving a source assist-voltage VSSab, a third local source assist-voltage node for receiving a source assist-voltage VSSa1, and a fourth local source assist-voltage node for receiving a source assist-voltage VSSa2 with VSSaa, VSSab, VSSa1, and VSSa2 generated by a source assist-voltage generator circuit (VSSAG) coupled to the first local source assist-voltage node, the second local source assist-voltage node, the third local source assist-voltage node, and the fourth local source assist-voltage node. According to various embodiments, an SRAM cell may include a first local word-line assist-voltage node for receiving a word-line assist-voltage of a first word line WL1 and a second local word-line assist-voltage node for receiving a word-line assist-voltage of a second word line WL2 with the word-line assist-voltages of the WL1 and WL2 generated by a word-line assist-voltage generator circuit (WLAG) coupled to the first local word-line assist-voltage node and the second local word-line assist-voltage node. The generated power-supply assist-voltages VDDa, VDDa1, and VDDa2 may be substantially equal to or less than VDD provided, for example, by a power-supply source. The generated power-supply assist-voltages VDDa, VDDa1, and VDDa2 may be substantially equal to or higher than a system ground voltage VSS. The generated local source assist-voltages VSSaa, VSSab, VSSa1, VSSa2 may be substantially equal to or higher than VSS. The generated local source assist-voltages VSSaa, VSSab, VSSa1, VSSa2 may be substantially equal to or less than VDD provided, for example, by a power-supply source.

The generated word-line assist-voltages of WL1 and WL2, normally being equal to VSS in hold and standby modes, may be substantially equal to VDD, or less than VDD but higher than VSS. The local power-supply assist-voltages VDDa, VDDa1, and VDDa2, the local source assist-voltages VSSaa, VSSab, VSSa1, and VSSa2, and local word-line assist-voltages of WL1 and WL2 are provided to one or more transistors of the SRAM cell. The system supply voltage VDD may be any positive supply voltage suitable for the application, but generally excludes negative or ground voltages.

The first local power-supply assist-voltage node is the common body terminals of two pull-up PMOS transistors of the latch in the SRAM cell and the second and the third local power-supply assist-voltage nodes are the source terminals of the two pull-up PMOS transistors, respectively, of the latch in the SRAM cell. The first and the second local source assist-voltage nodes are the body terminals of two pull-down NMOS transistors, respectively, of the latch in the SRAM cell, and the third and the fourth local source assist-voltage nodes are the source terminals of the two pull-down NMOS transistors, respectively, of the latch in the SRAM cell.

For embodiments wherein the generated power-supply assist-voltages VDDa1/VDDa2 or VDDa/VDDa1/VDDa2 are less than VDD, VDDa1/VDDa2 or VDDa/VDDa1/VDDa2 may increase the write margin for a write operation and may reduce current leakage for hold and standby operations. For embodiments wherein the generated local power-supply assist-voltages VDDa1/VDDa2 or VDDa/VDDa1/VDDa2 are less than VDD, the value of VDDa/VDDa1/VDDa2 for write assist may be not the same with that for hold or standby assist. For embodiments wherein the generated local source assist-voltages VSSa1/VSSa2 or VSSaa/VSSab/VSSa1/VSSa2 are higher than VSS, VSSa1/VSSa2 or VSSaa/VSSab/VSSa1/VSSa2 may increase the read stability for a read operation of a GSC 6T cell and may reduce current leakage for a hold or a standby (or power-down) operation of a differential 6T or GSC 6T cell. For embodiments wherein the generated local source assist-voltages VSSa1/VSSa2 or VSSaa/VSSab/VSSa1/VSSa2 are higher than VSS, the value of VSSaa/VSSab/VSSa1/VSSa2 for read assist may be not the same with that for hold or standby assist. For embodiments wherein the generated local power-supply assist-voltages VDDa1/VDDa2 or VDDa/VDDa1/VDDa2 are less than VDD and the generated local source assist-voltages VSSa1/VSSa2 or VSSaa/VSSab/

VSSa1/VSSa2 are higher than VSS, VDDa1/VDDa2 or VDDa/VDDa1/VDDa2, and VSSa1/VSSa2 or VSSa/VSSab/VSSa1/VSSa2 can be jointly used for write assist for a GSC 6T cell, and separately or jointly used for hold or standby assist for a differential 6T or GSC 6T cell. For embodiments wherein VDDa1/VDDa2 or VDDa/VDDa1/VDDa2, and VSSa1/VSSa2 or to VSSaa/VSSab/VSSa1/VSSa2 are jointly used for hold or standby assist for a differential 6T or GSC 6T cell, the value of VDDa/VDDa1/VDDa2 may be not the same with that of VDDa/VDDa1/VDDa2 for VDDa1/VDDa2- or VDDa/VDDa1/VDDa2-alone hold and standby assist. For embodiments wherein VDDa1/VDDa2 or VDDa/VDDa1/VDDa2, and VSSa1/VSSa2 or VSSaa/VSSab/VSSa1/VSSa2 are jointly used for hold or standby assist for a differential 6T or GSC 6T cell, the value of VSSaa/VSSab/VSSa1/VSSa2 may be not the same with that of VSSaa/VSSab/VSSa1/VSSa2 for VSSa1/VSSa2- or VSSaa/VSSab/VSSa1/VSSa2-alone hold and standby assist. According to various embodiments, the generated local word-line assist-voltage of WL1 or WL2 may be substantially equal to VDD for performing a read or write operation of a GSC 6T cell. According to various embodiments, the generated local word-line assist-voltages VWL1 and WL2, normally being equal to VSS in hold and standby modes, may be some voltage less than VDD for performing a read or write operation of a differential 6T cell.

Figure 4A:
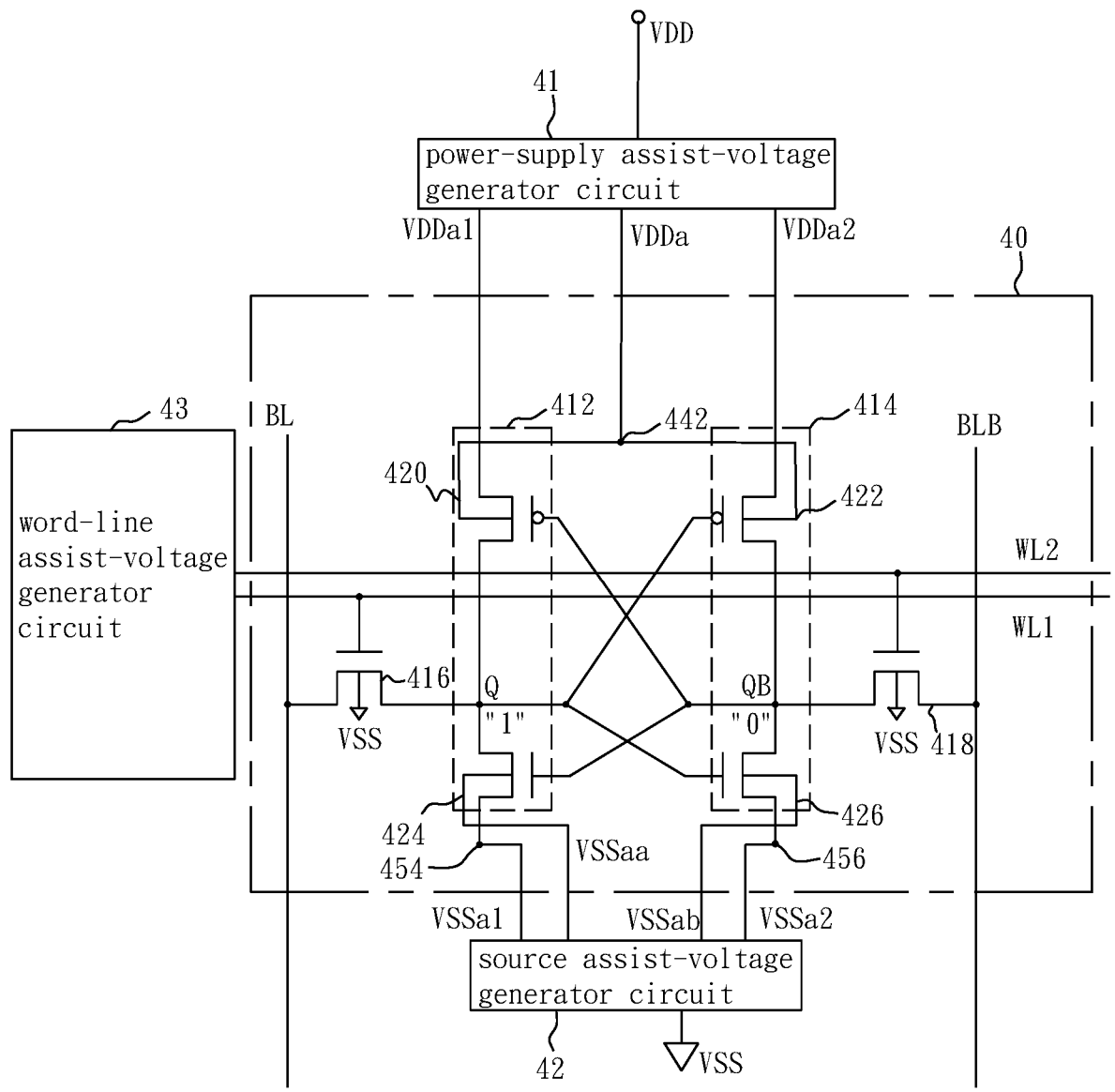
FIG. 4a is a diagram schematically illustrating a memory device according to ad first embodiment of the present invention.

Illustrated in FIG. 4a is a schematic of an SRAM device, in accordance with various embodiments of the present invention. The memory device may be a synchronous or an asynchronous SRAM device, depending on the application; that is, the memory device may be synchronous or asynchronous to the system clock. As illustrated in FIG. 4a, the memory device includes an SRAM cell 40, a power-supply assist-voltage generator circuit (or called VDDA generator circuit; VDDAG) 41, a source assist-voltage generator circuit (or called VSSA generator circuit; VSSAG) 42, and a word-line assist-voltage generator circuit (WLAG) 43. The input of the power-supply assist-voltage generator circuit 41 receives VDD. The input of the source assist-voltage generator circuit 42 receives VSS. The power-supply assist-voltage generator circuit 41 may send out VDD to the SRAM cell 40 or cooperate with the input to provide VDD for the SRAM cell 40. The source assist-voltage generator circuit 42 may send out VSS to the SRAM cell 40 or cooperate with the input to provide VSS for the SRAM cell 40. When the SRAM cell 40 is configured as a differential 6T SRAM cell, WL1 and WL2 can be viewed as a single word line WL. At the same time, VDDa provided by VDDAG 41 is equal to VDD. VSSaa, VSSab, VSSa1, and VSSa2 are typically equal to VSS in a 6T SRAM cell. The operation of a conventional 6T cell will not be explained in detail herein except where such explanation aids in the understanding of the present invention. When the SRAM cell 40 is configured as a GSC 6T SRAM cell, it may accept split word-line assist-voltages of WL1 and WL2, split power-supply assist-voltages VDDa, VDDa1, and VDDa2, and split source assist-voltages VSSaa, VSSab, VSSa1, and VSSa2.

According to various embodiments, VDDAG 41 may be configured to drive power-supply assist-voltages VDDa, VDDa1, and VDDa2 to the first, second, and third local power-supply assist-voltage nodes, respectively. According to various embodiments, VSSAG 42 may be configured to drive source assist-voltages VSSaa, VSSab, VSSa1, and VSSa2 to the first, second, third, and fourth local source assist-voltage nodes, respectively. According to various embodiments, VWLAG 43 may be configured to drive a first or second word-line assist-voltage to the first and second local word-line assist-voltage nodes, respectively.

The generated local power-supply assist-voltages, source assist-voltages, and word-line assist-voltages may depend at least in part on the status of SRAM cell 40. For example, SRAM cell 40 may at times be in a read mode, a write mode, a hold mode, a hold mode with a read-half-select concern, a hold mode with a write-half-select concern, or a power-down mode. With regard to the hold mode, such a status may refer generally to a data retention mode for an un-accessed cell while some other cells are in a read, write, or hold mode. With regard to the hold mode with a read-half-select concern, such a status may refer generally to a data retention mode for a cell with the word-line being asserted but it actually wants to keep the stored data unchanged. With regard to the hold mode with a write-half-select concern, such a status may refer generally to a data retention mode for an un-accessed cell with the write-assist voltage being applied on it and/or with bit-line voltages being disturbed by a read or write operation. With regard to the power-down mode, such a status may refer generally to a lower-power-consumption data-retention mode for all the cells in the memory device. A power-down mode may refer to a standby mode.

According to various embodiments, the memory device in accordance with the present invention can be fabricated in integrated circuit process, and particularly in a complementary-MOS process or simply a CMOS process. The CMOS process can fabricate both p-type transistors (PMOS) and n-type transistors (NMOS). The CMOS process can start on a p-type substrate and implant a deep n-type-well (N-Well) for the following process steps. Such a CMOS process is called a deep N-Well CMOS process. With a deep N-Well CMOS process, we can implant a p-type-well (P-Well) for fabricating n-type (NMOS) transistors, and implant an n-type-well (N-Well) for fabricating p-type (PMOS) transistors. With such a deep N-Well CMOS process, NMOS transistors can be separated into different groups to be fabricated in separated P-Wells, and PMOS transistors can be separated into different groups to be fabricated in separated N-wells. In a general sense, each NMOS can have an independent body terminal, an independent drain terminal, an independent gate terminal, and an independent source terminal, and each PMOS can also have an independent body terminal, an independent drain terminal, an independent gate terminal, and an independent source terminal. No matter PMOS or NMOS transistors, the assist voltages can be applied to the source terminal and the body terminal independently.

Figure 4B:
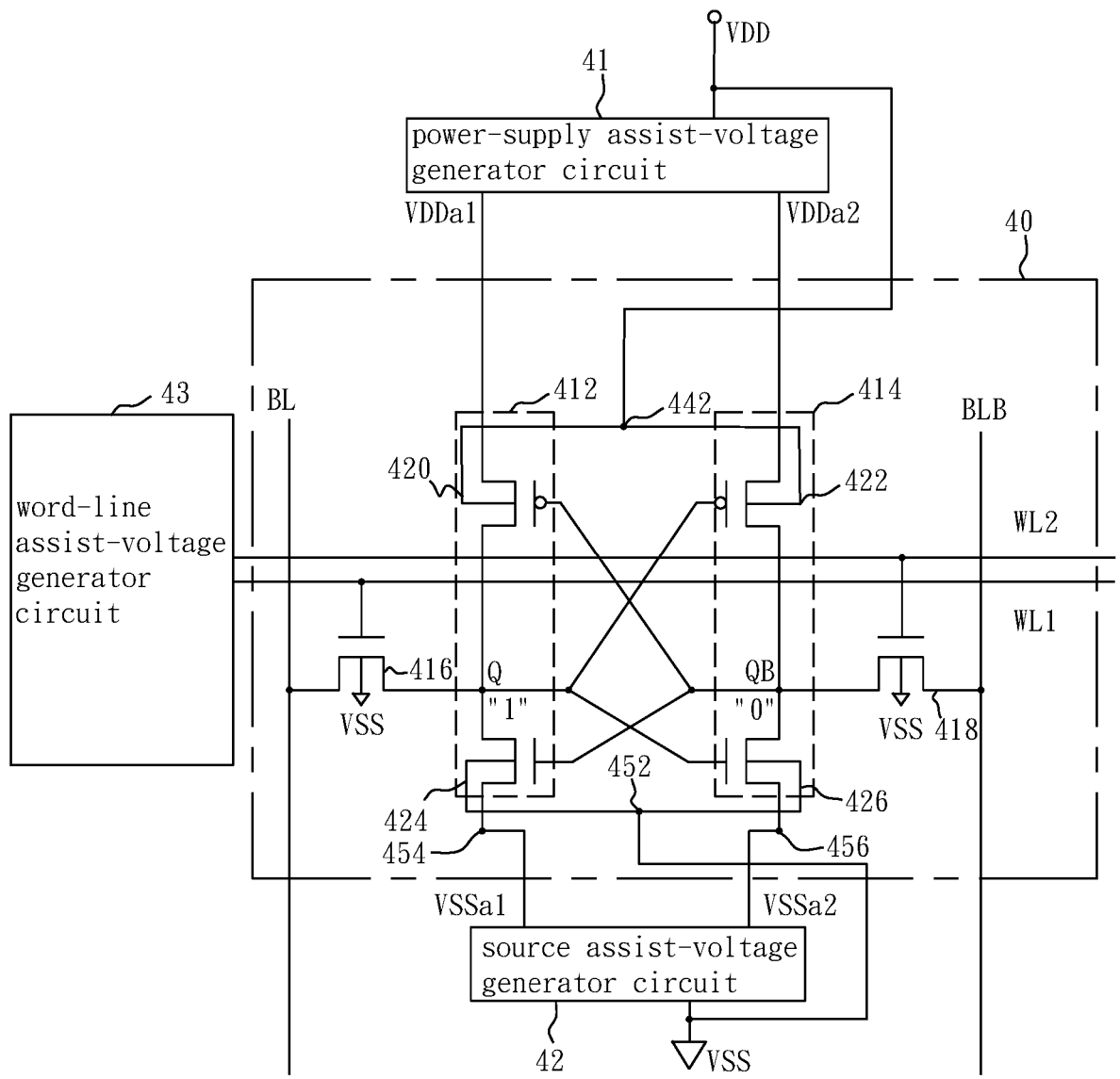
FIG. 4b is a diagram schematically illustrating a memory device according to a second embodiment of the present invention.
Figure 4C:
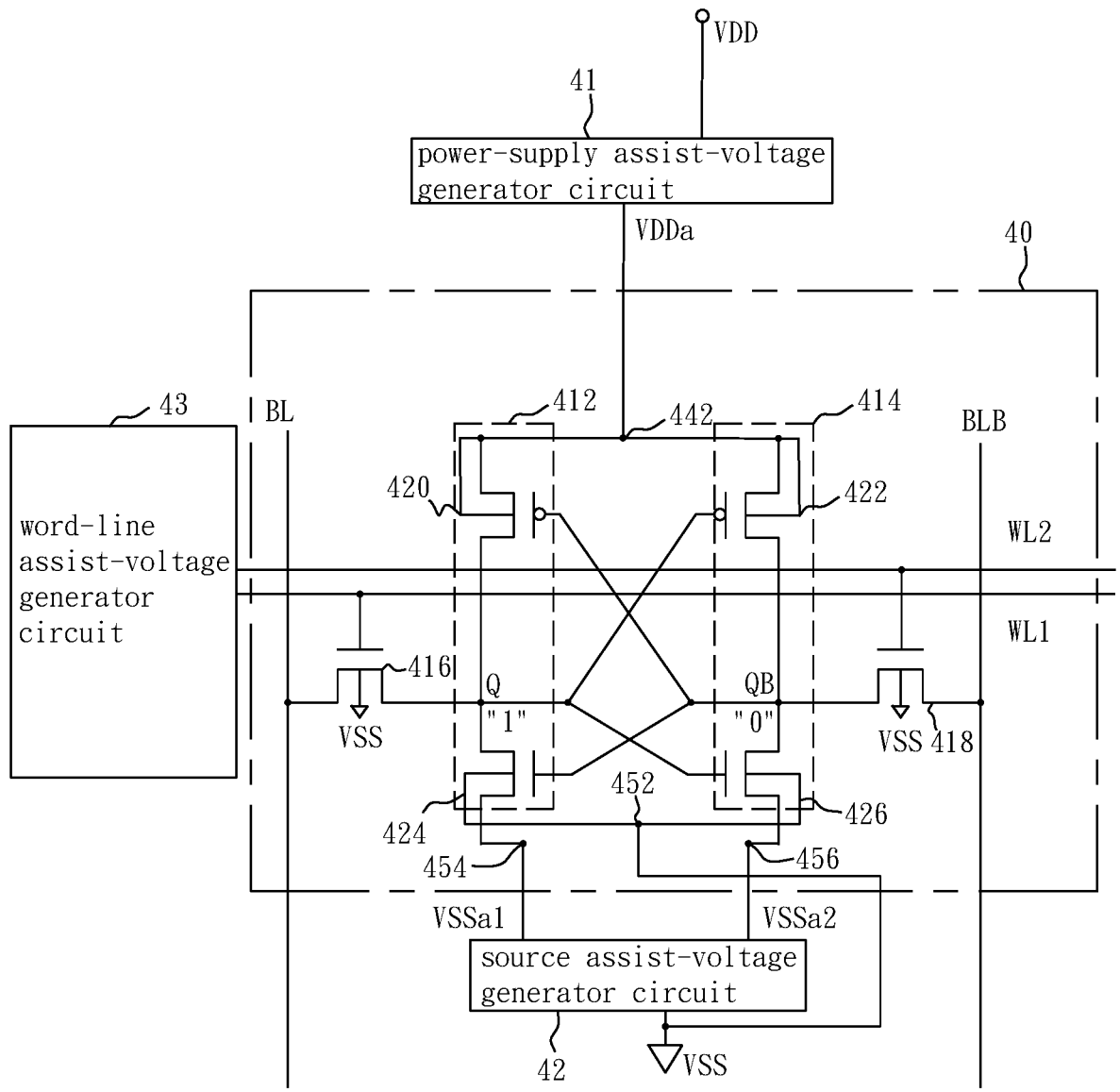
FIG. 4c is a diagram schematically illustrating a memory device according to a third embodiment of the present invention.
Figure 4D:
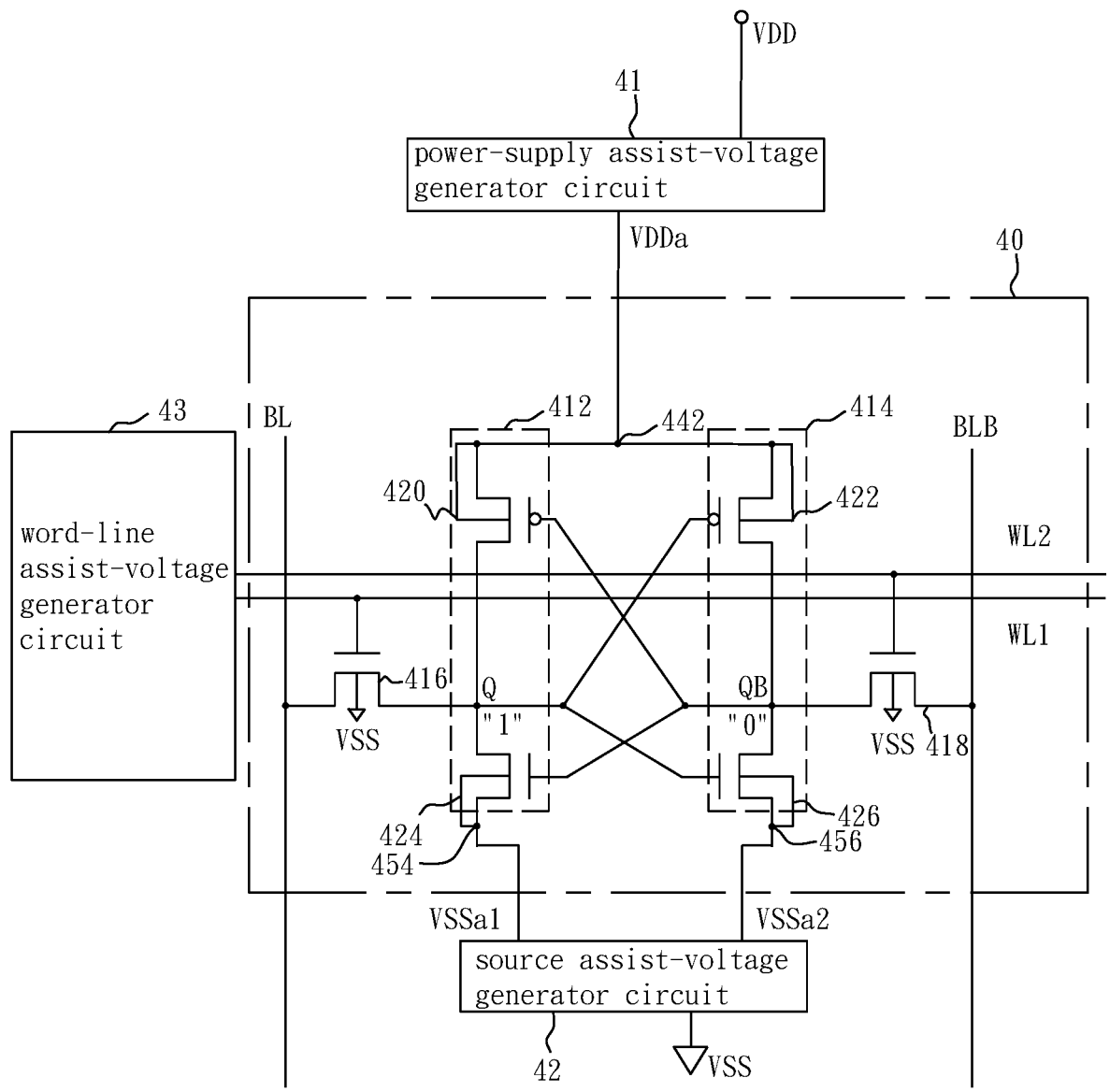
FIG. 4d is a diagram schematically illustrating a memory device according to a fourth embodiment of the present invention.

The CMOS process can also start on a p-type substrate without a following deep N-Well processing step. Such a CMOS process is called an N-Well CMOS process. With an N-Well CMOS process, all the NMOS transistors seat on a common p-type substrate so that they have a common body terminal and can have different source terminals. The common body terminal typically is typically provided with the system ground voltage VSS. With an N-Well CMOS process, we can implant an n-type-well (N-Well) for fabricating p-type (PMOS) transistors. In a general sense, each PMOS can also have an independent body terminal, an independent drain terminal, an independent gate terminal, and an independent source terminal. Illustrated in FIG. 4b is another schematic of an SRAM device fabricated in an N-Well CMOS process, in accordance with various embodiments of the present invention. Illustrated in FIG. 4c is another schematic of an SRAM device fabricated in an N-Well CMOS process and with a simplified assist method with VDDa1 and VDDa2 being equal to VDDa, in accordance with various embodiments of the present invention. Illustrated in FIG. 4d is another schematic of an SRAM device fabricated in a deep N-Well CMOS process with a simplified assist method with VDDa1 and VDDa2 being equal to VDDa and with another assist method omitting VSS and providing VSSa1 and VSSa2 to the source and body terminals of pull-down transistors 424 and 426, respectively, in accordance with various embodiments of the present invention. Without loss of generality, the following descriptions mostly refer to the embodiment in FIG. 4c.

Figure 5:
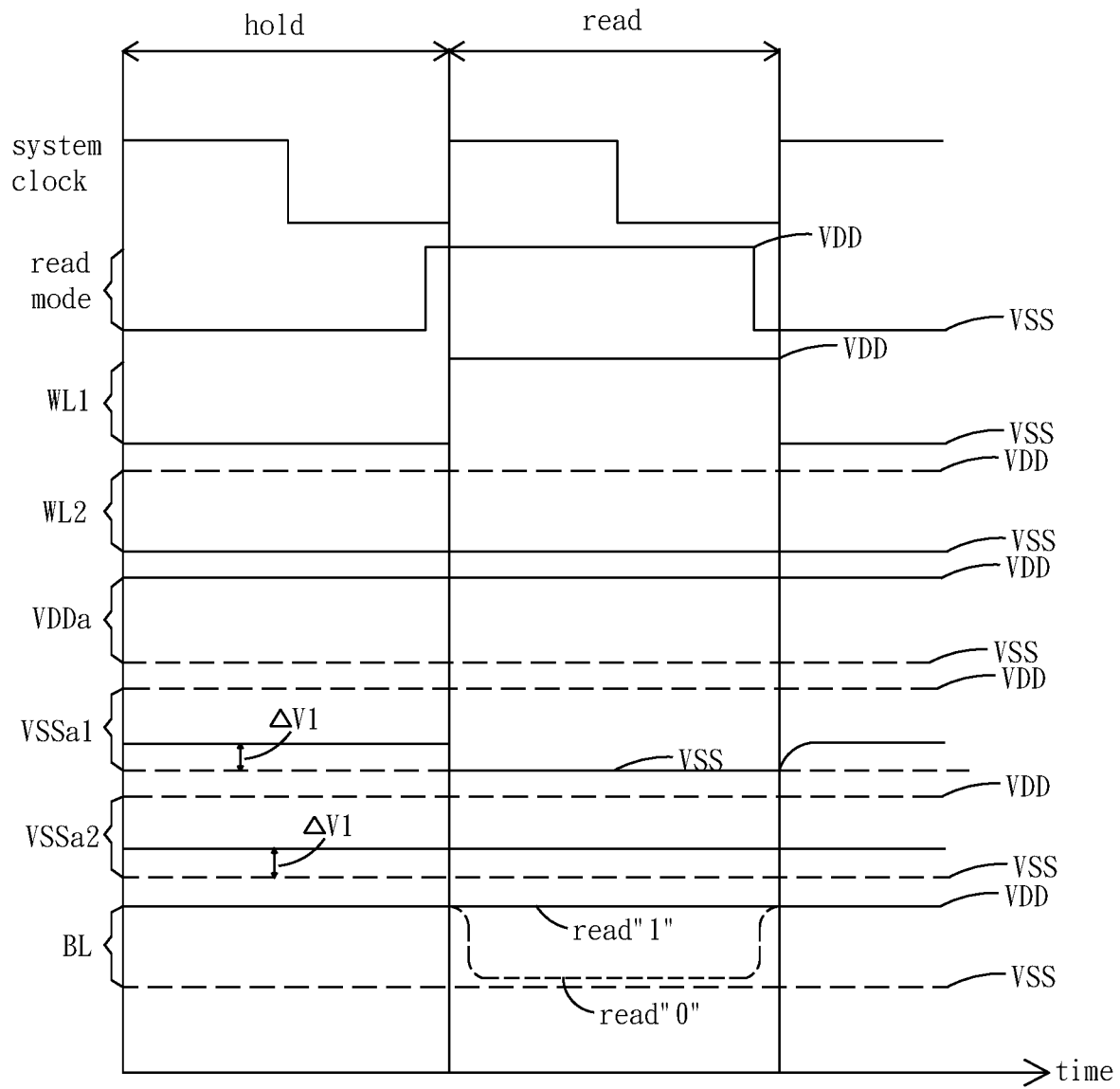
FIG. 5 is a diagram illustrating voltage waveforms of a generic split-control (GSC) 6T memory cell in hold and read modes according to an embodiment of the present invention.

Illustrated in FIG. 5 is an exemplary timing diagram of hold and read operations for various embodiments in accordance of the present invention of a memory device using a GSC 6T cell in FIG. 4c. According to various embodiments, during a hold mode, the power-supply assist-voltage VDDa provided to local power-supply assist-voltage node 442 may be some voltage substantially equal to VDD. During a hold mode, the source assist-voltage VSSa1 provided to the third local source assist-voltage node 454 and the source assist-voltage VSSa2 provided to the fourth local source assist-voltage node 456 by VSSAG 42 may be some voltage $\Delta V1$ higher than VSS. Due to $\Delta V1$, the effective supply voltage of the SRAM cell in a hold mode is equal to VDD-$\Delta V1$ instead of VDD, and there is a negative body-biasing effect between the body and the source terminals of pull-down transistors 424 and 426 in the SRAM cell. Comparing to the conventional operation condition with VSSa1/VSSa2 being equal to VSS, the SRAM cell with the hold-assist scheme is in a lower-leakage condition.

Before a read operation, bit-lines BL and BLB may be pulled high (or called pre-charged high). Then, the first word-line WL1 is asserted high and VSSa1 is pulled down to VSS to begin the read operation. The access transistor 416 is switched on, and the value stored at node Q may then be transferred to BL according to known conventions. For example, if node Q holds a logic 1 and node QB holds a logic 0, BL may keep at the pre-charged-high status. If node Q holds a logic 0 value and node QB holds a logic 1 value, BL may be discharged through pass transistor 416 and pull-down transistor 424 to a logic 0. According to various embodiments, during a read mode, the assist-voltage provided to word-line WL1 by WLAG 43 may be some voltage substantially equal to VDD, and the assist-voltage provided to word-line WL2 by WLAG 43 may be some voltage substantially equal to VSS. According to various embodiments, during a read mode, the source assist-voltage VSSa1 provided to the third local source assist-voltage node 454 by VSSAG 42 may be some voltage substantially equal to VSS, and the source assist-voltage VSSa2 provided to the fourth local source assist-voltage node 456 by VSSAG 42 may be some voltage $\Delta V1$ higher than VSS. For the single-sided read operation, VSSa1 is set to VSS to enhance the signal strength of the stored data, and VSSa2 is set to be $\Delta V1$ higher than VSS to weaken the disturbance from inverter 414 to inverter 412. Therefore, a GSC 6T cell has a high read stability and a high read static noise margin (RSNM).

If a cell is placed in the same row with the accessed cell in a read mode but it actually hopes to hold the stored data, the cell faces a read-half-select concern. For such a read-half-select (rHS) cell, its VDDa is equal to VDD, VSSa1 is equal to VSS, and VSSa2 is $\Delta V1$ higher than VSS. Therefore, the rHS cell and the cell in a read mode face the same operation condition and have the same stability. If a cell is placed in the same column with the accessed cell in a read mode, it actually stays in a hold mode because the word-line is not asserted. According to various embodiments, wherein a cell is in a hold mode and placed in the same column with the accessed cell in a read mode, its VDDa is equal to VDD and both VSSa1 and VSSa2 are $\Delta V1$ higher than VSS. Therefore, such a cell has a high hold noise margin. If a cell is placed neither in the same row nor in the same column with the accessed cell in a read mode, it stays quietly in a hold mode because the word-line is not asserted and bit-lines keep at the pre-charge status. Therefore, such a cell has a high hold noise margin.

Figure 6:
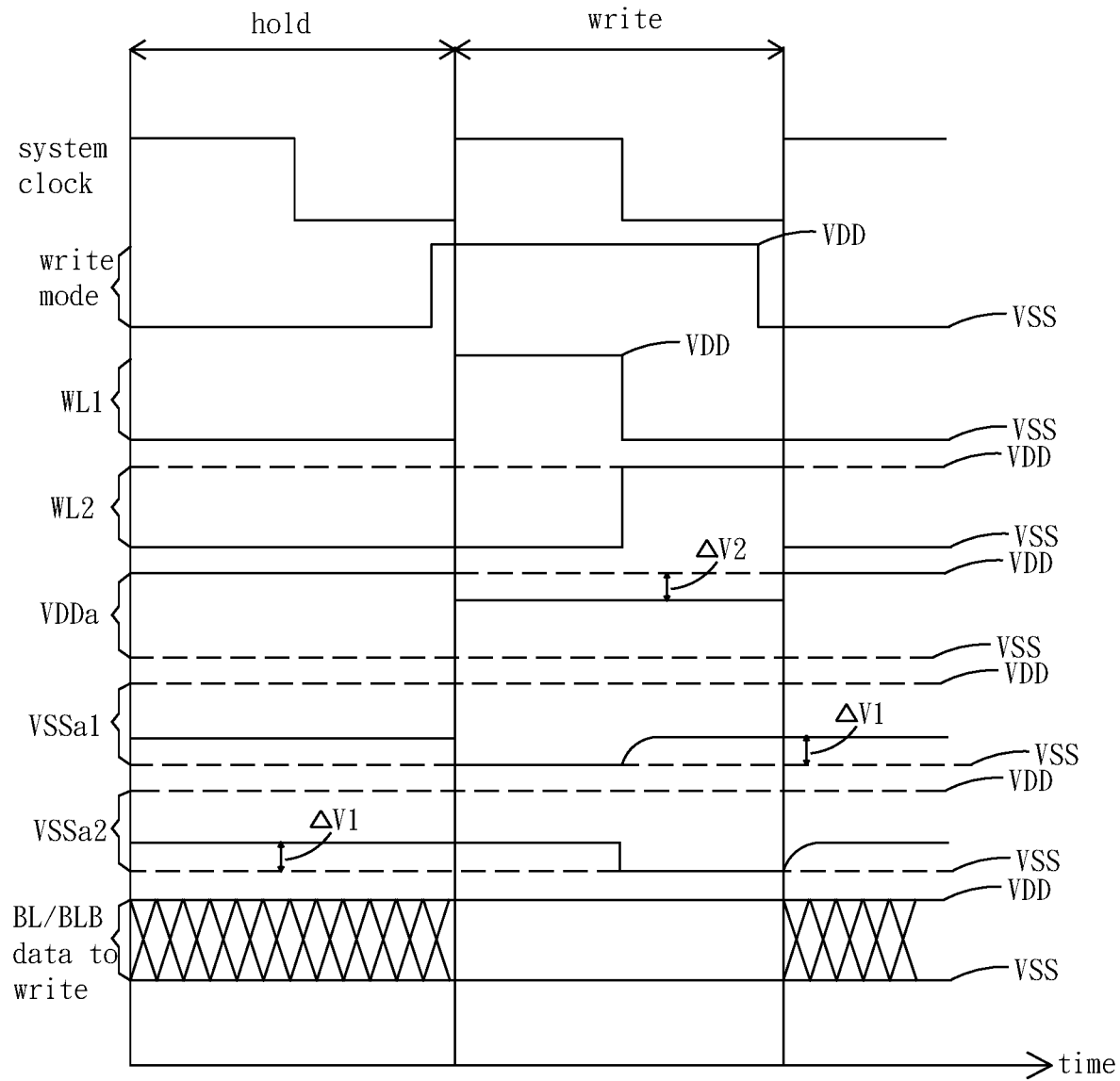
FIG. 6 is a diagram illustrating voltage waveforms of a GSC 6T memory cell in hold and write modes according to an embodiment of the present invention.

Illustrated in FIG. 6 is an exemplary timing diagram of hold and write operations for various embodiments in accordance of the present invention of a memory device using a GSC 6T cell. The detailed description for the hold mode has been given before. Before a write operation, either BL or BLB is pulled down to VSS according to the data to write. During the first half-cycle of a write operation, VSSa1 is pulled down to VSS, and the first word-line WL1 is asserted high. The pass transistor 416 is switched on, and the value on BL may then be written to node Q through the help of VDDa lowering. For example, if node Q holds a logic 1 value and BL is pulled down to VSS in advance, node Q may be discharged through pass transistor 416 to a logic 0 through the help of a lower VDDa value that can weaken the driving ability of driving transistor 420. According to various embodiments, during a write mode, the power-supply assist-voltage VDDa provided to local power-supply assist-voltage node 442 by VDDAG 41 may be some voltage $\Delta V2$ less than VDD. According to various embodiments, during the first half-cycle (interval) of a write mode, the source assist-voltage VSSa1 provided to the third local source assist-voltage node 454 by VSSAG 42 may be set to some voltage substantially equal to VSS, and the source assist-voltage VSSa2 provided to the fourth local source assist-voltage node 456 by VSSAG 42 may be some voltage $\Delta V1$ higher than VSS. According to various embodiments, during the first half-cycle (interval) of a write mode, the voltage provided to the first word-line WL1 by WLAG 43 may be some voltage substantially equal to VDD, and the voltage provided to the second word-line WL2 by WLAG 43 may be some voltage substantially equal to VSS. If node Q holds a logic 1 value and node QB holds a logic 0 value, a raised $\Delta V1$ for VSSa2 also weakens the driving ability of the driving transistor 420 to increase the write margin of the single-ended write operation. On the other hand, if node Q holds a logic 0 value and node QB holds a logic 1 value, the single-sided operation condition is the same with that in a read mode and with a good read stability, and the SRAM cell 40 needs the other half-cycle to finish the write operation.

During the second half-cycle (interval) of a write mode, VSSa1 is pulled up gradually to $\Delta V1$ higher than VSS, while VSSa2 is pulled down to VSS. In the meanwhile, the first word-line WL1 is pulled down to VSS and the second word-line WL2 is asserted high during the second half-cycle of a write mode. The pass transistor 418 is switched on, and the value on BLB may then be written to node QB through the help of VDDa lowering. For example, if node QB holds a logic 1 value and BLB is pulled down to VSS, node QB may be discharged through pass transistor 418 to a logic 0 through the help of a lower VDDa value that can weaken the driving ability of driving transistor 422. According to various embodiments, during the second half-cycle (interval) of a write mode, the source assist-voltage VSSa2 provided to the fourth local source assist-voltage node 456 by VSSAG 42 may be set to some voltage substantially equal to VSS, and the source assist-voltage VSSa1 provided to the third local source assist-voltage node 454 by VSSAG 42 may be some voltage $\Delta V1$ higher than VSS. According to various embodiments, during the second half-cycle (interval) of a write mode, the voltage provided to the second word-line WL2 by WLAG 43 may be some voltage substantially equal to VDD, and the voltage provided to the first word-line WL1 by WLAG 43 may be some voltage substantially equal to VSS. If node QB holds a logic 1 value and node Q holds a logic 0 value, a raised ΔV1 for VSSa1 also weakens the driving ability of driving transistor 422 to increase the write margin of the single-ended write operation. On the other hand, if node QB holds a logic 0 value and node Q holds a logic 1 value, the single-sided write has been finished in the first half-cycle.

If a cell is placed in the same row with the accessed cell in a write mode but it actually hopes to stay in a hold mode, the cell faces a read-half-select concern in the first and second half-cycles of a write mode. For such a cell, its VDDa is equal to VDD; meanwhile, VSSa1 is pulled down to VSS with WL1 being asserted high in the first half-cycle, and VSSa2 is pulled down to VSS with WL2 being asserted high in the second half-cycle. We say that this cell is in a hold mode with a read-half-select concern in the first and second half-cycles of a write mode. The rHS cell and the cell in the read mode face the same operation condition so that they have the same read stability. If a cell is placed in the same column with the accessed cell in a write mode, it actually stays in a hold mode because the word-lines are not asserted. According to various embodiments, wherein a cell is in the hold mode and placed in the same column with the accessed cell in a write mode, the power-supply assist-voltage VDDa provided to local power-supply assist-voltage node 442 by VDDAG 41 may be some voltage ΔV2 less than VDD, and the source assist-voltages VSSa1 and VSSa2 provided to the third and fourth local source assist-voltage nodes 454 and 456, respectively, by VSSAG 42 may be some voltage ΔV1 higher than VSS. Therefore, such a cell faces a write-half-select (wHS) concern, and we call such a cell a wHS cell. The selection of ΔV1 and ΔV2 by VSSAG 42 and VDDAG 41, respectively, can be achieved so that such a wHS cell has an enough hold margin. If a cell is placed neither in the same row nor in the same column with the accessed cell in a write mode, it stays in a hold mode because the word-line is not asserted, bit-lines are kept at the pre-charge status, and VDDa is equal to VDD. Therefore, such a cell has a high hold noise margin.

Figure 7:
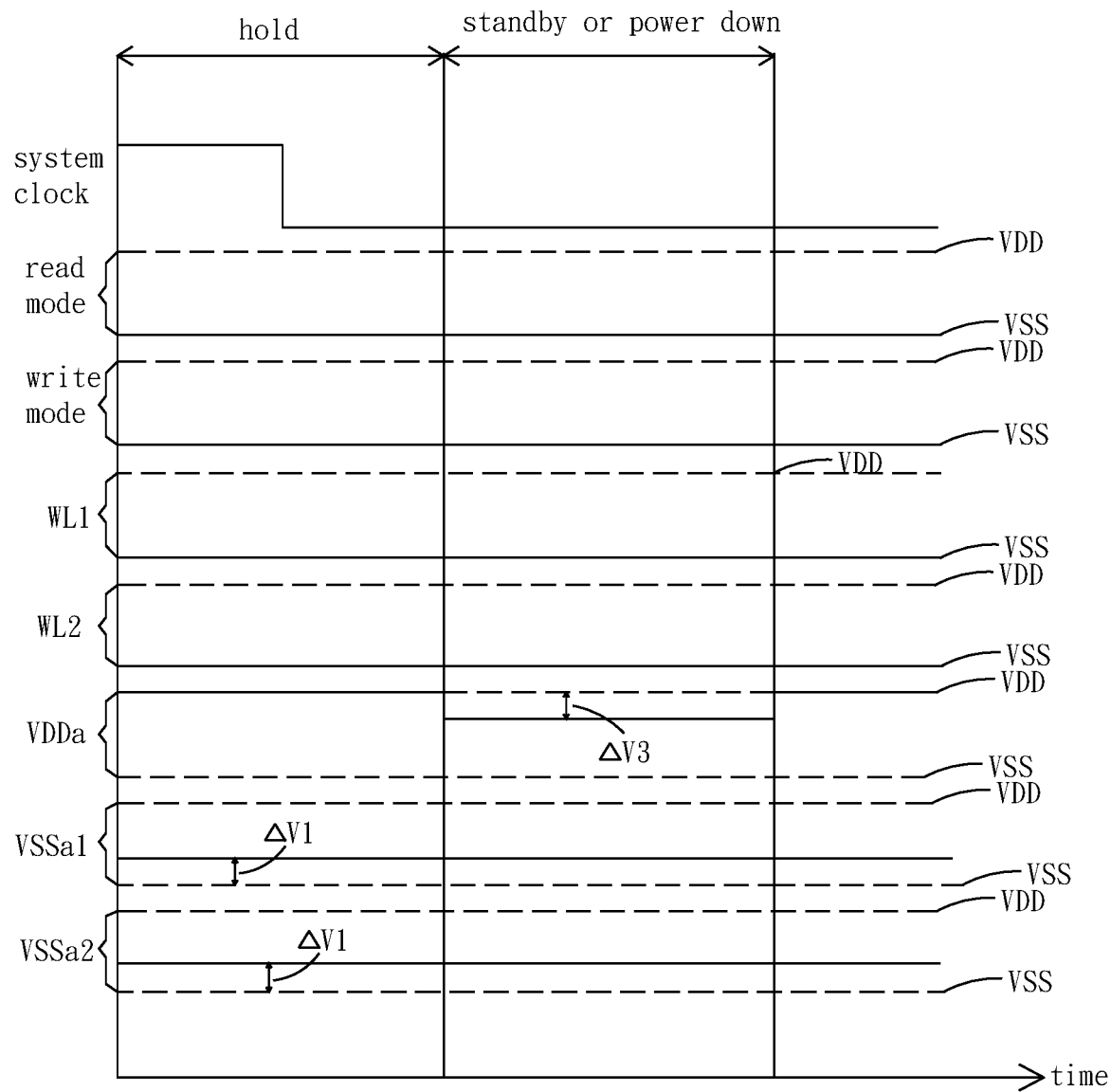
FIG. 7 is a diagram illustrating voltage waveforms of a GSC 6T memory cell in hold and standby modes according to an embodiment of the present invention.

For various embodiments, VDDAG 41 and VSSAG 42 may be configured to further minimize current leakage of SRAM cell 40 during a power-down mode. Illustrated in FIG. 7 is an exemplary timing diagram of hold and standby modes for various embodiments of such a memory device using a GSC 6T cell. The detailed description for a hold mode has been given before. According to various embodiments, during a standby mode, the assist-voltage provided to the first word-line WL1 by WLAG 43 and the assist-voltage provided to the second word-line WL2 by WLAG 43 may be some voltage substantially equal to VSS. According to various embodiments, during a standby mode, the power-supply assist-voltage VDDa provided to local power-supply assist-voltage node 442 by VDDAG 41 may be some voltage ΔV3 less than VDD, and the source assist-voltage VSSa1 provided to the third local source assist-voltage node 454 and the source assist-voltage VSSa2 provided to the fourth local source assist-voltage node 456 by VSSAG 42 may be some voltage ΔV1 higher than VSS. The selection of ΔV3 and ΔV1 by VDDAG 41 and VSSAG 42, respectively, can be achieved so that such a cell in a standby mode has an enough hold margin. Now due to ΔV3 and ΔV1, the effective supply voltage of an SRAM cell in a standby mode is equal to VDD-ΔV3-ΔV1 instead of VDD, and there is a stronger negative body-biasing effect between the body and source nodes of pull-up PMOS and pull-down NMOS transistors of the SRAM cell. The SRAM cell with the described standby-assist is in an ultra-low-leakage condition.

Figure 8:
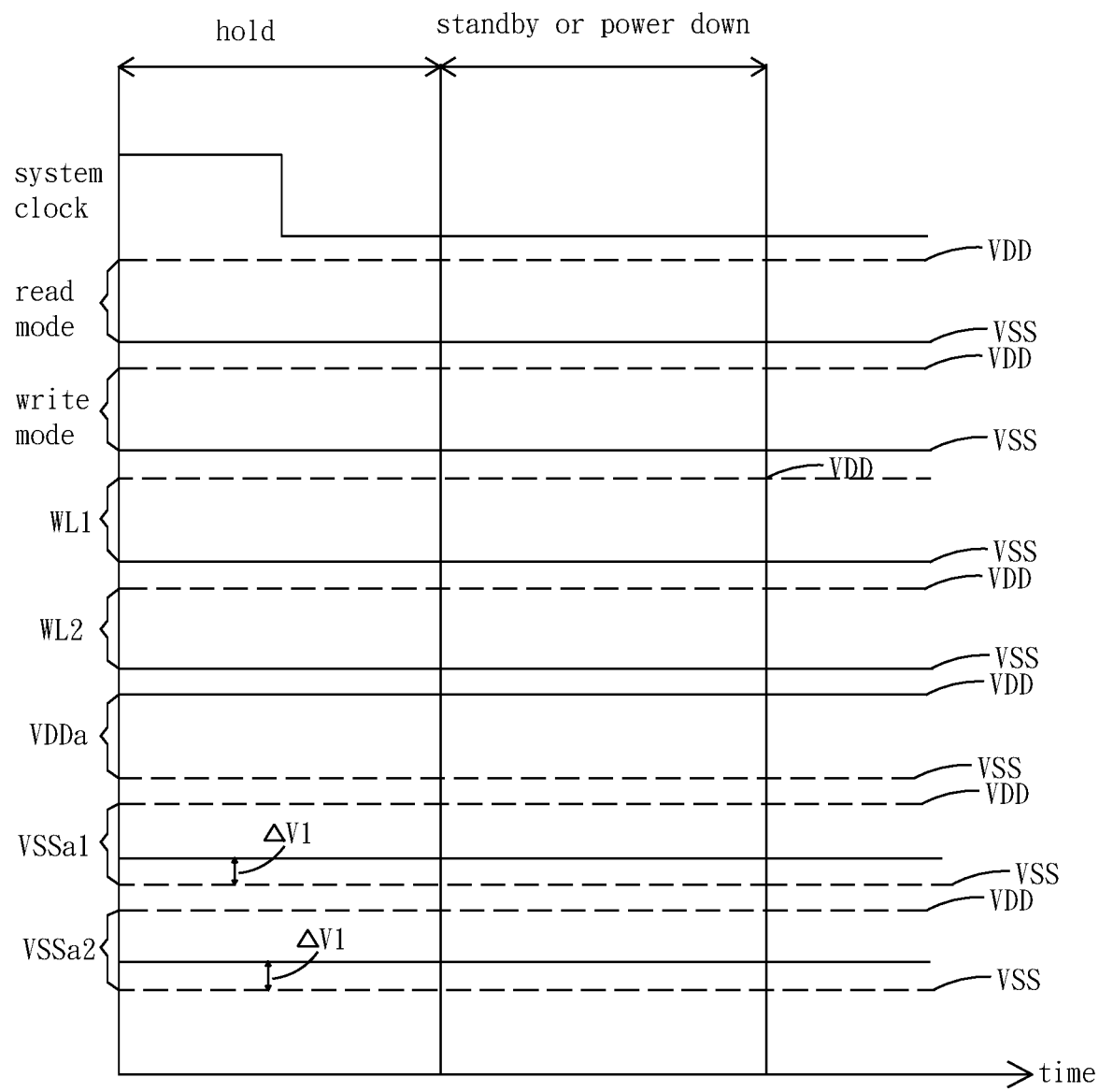
FIG. 8 is a diagram illustrating voltage waveforms of a GSC 6T memory cell in a hold mode and another standby mode according to an embodiment of the present invention.

Illustrated in FIG. 8 is another exemplary timing diagram of hold and standby modes for various embodiments of such a memory device using a GSC 6T cell. The detailed description of a hold mode has been given before. According to various embodiments, during a standby mode, the power-supply assist-voltage VDDa provided to local power-supply assist-voltage node 442 by VDDAG 41 may be some voltage substantially equal to VDD, and the source assist-voltage VSSa1 provided to the third local source assist-voltage node 454 and the source assist-voltage VSSa2 provided to the fourth local source assist-voltage node 456 by VSSAG 42 may be some voltage ΔV1 higher than VSS.

Figure 9:
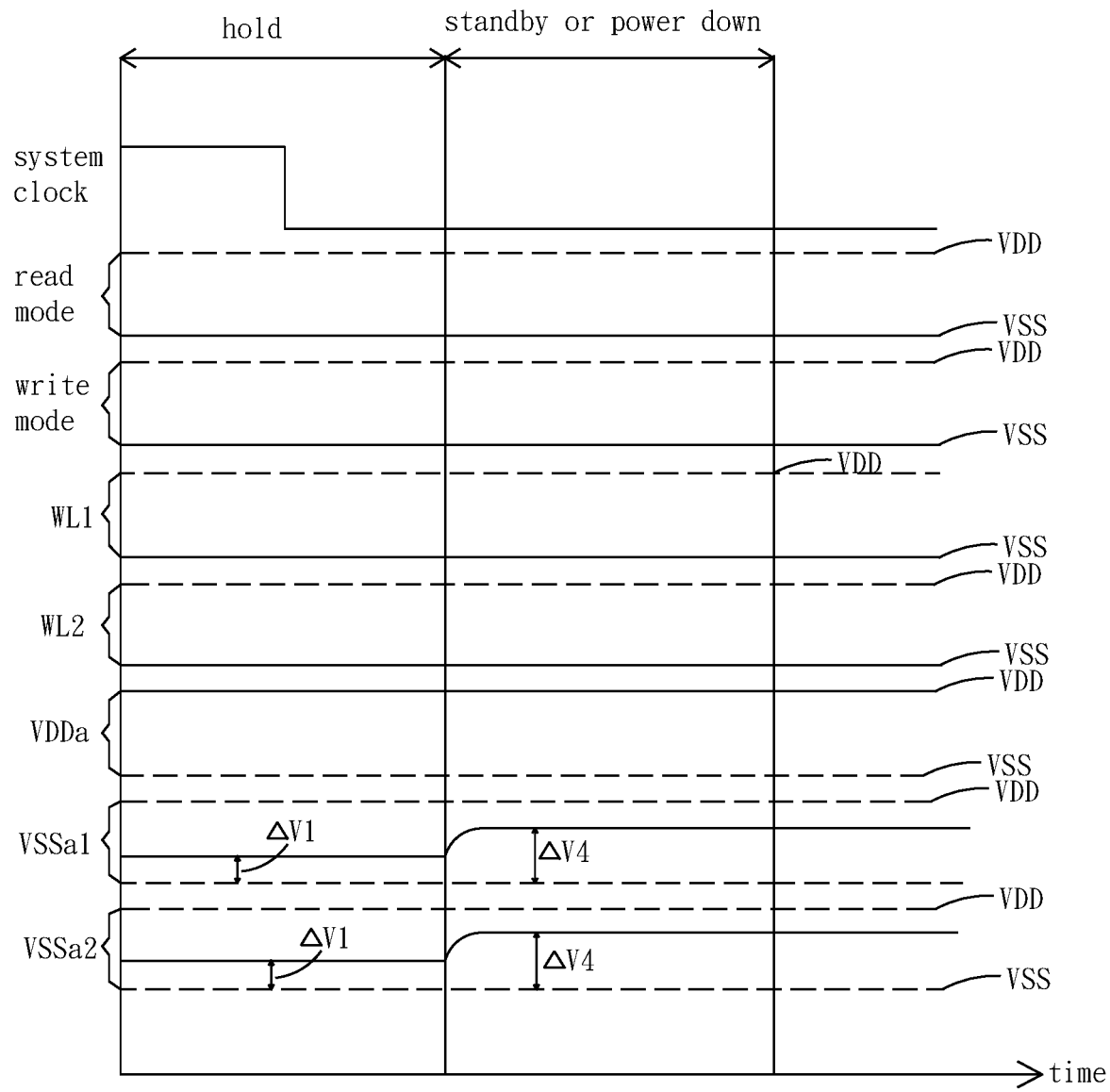
FIG. 9 is a diagram illustrating voltage waveforms of a GSC 6T memory cell in a hold mode and a further standby mode according to an embodiment of the present invention.

Illustrated in FIG. 9 is another exemplary timing diagram of hold and standby modes for various embodiments of such a memory device using a GSC 6T cell. The detailed description of a hold mode has been given before. According to various embodiments, during a standby mode, the assist-voltage provided to the first word-line WL1 by WLAG 43 and the assist-voltage provided to the second word-line WL2 by WLAG 43 may be some voltage substantially equal to VSS. According to various embodiments, during a standby mode, the power-supply assist-voltage VDDa provided to local power-supply assist-voltage node 442 by VDDAG 41 may be some voltage substantially equal to VDD, and the source assist-voltage VSSa1 provided to the third local source assist-voltage node 454 and the source assist-voltage VSSa2 provided to the fourth local source assist-voltage node 456 by VSSAG 42 may be some voltage ΔV4 higher than VSS. The selection of ΔV4 by VSSAG can be achieved so that such a cell in a standby mode has an enough hold margin. Now due to ΔV4, the effective supply voltage of the SRAM cell in a standby mode is equal to VDD-ΔV4 instead of VDD, and there is an even stronger negative body-biasing effect between the body and source nodes of pull-down NMOS transistors of the SRAM cell. The SRAM cell with the described standby-assist is in an ultra-low-leakage condition.

Figure 10:
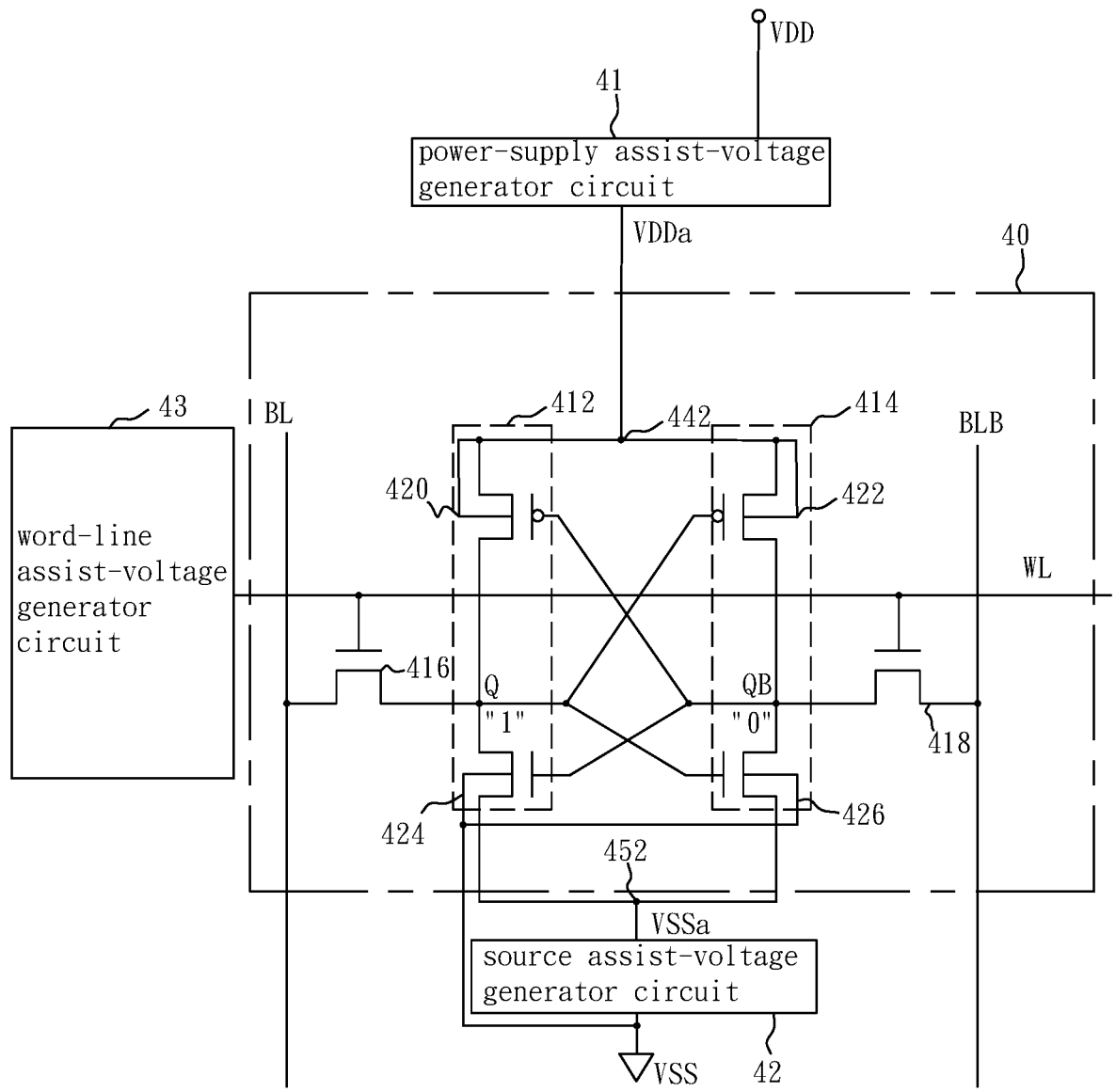
FIG. 10 is a diagram schematically illustrating a memory device according to a fifth embodiment of the present invention.
Figure 11:
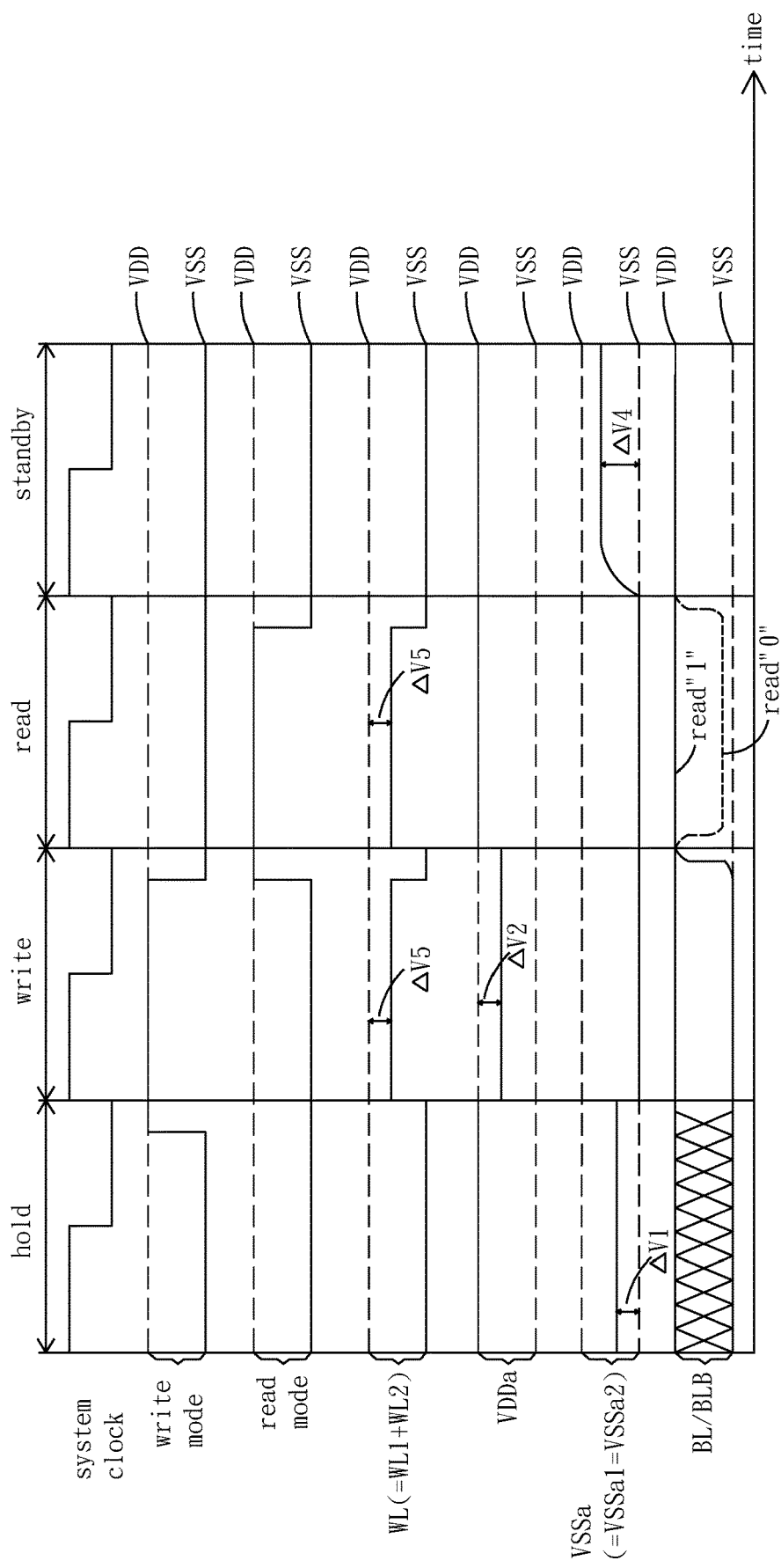
FIG. 11 is a diagram illustrating voltage waveforms of a differential 6T memory cell in hold, read, write, and standby modes according to an embodiment of the present invention.

According to various embodiments, the read-, write-, hold-, and standby-assist circuit can also be applied to a differential 6T cell. Illustrated in FIG. 10 is another schematic of an SRAM device using a differential 6T SRAM cell, in accordance with various embodiments of the present invention. The differential 6T SRAM cell 40 in FIG. 10 is configured to receive only a word-line assist-voltage provided by WLAG 43, only a local power-supply assist-voltage VDDa provided by VDDAG 41, and only a local source assist-voltage VSSa provided by VSSAG 42. Illustrated in FIG. 11 is an exemplary timing diagram of hold, write, read, and standby operations for various embodiments of such a memory device using a differential 6T cell. According to various embodiments, during a hold mode, the local power-supply assist-voltage VDDa provided to local power-supply assist-voltage node 442 by VDDAG 41 may be some voltage substantially equal to VDD, and the local source assist-voltage VSSa provided to local source assist-voltage node 452 by VSSAG 42 may be some voltage ΔV1 higher than VSS. Before a write operation, either BL or BLB is pulled down to VSS according to the data to write. In a double-ended write mode, VSSa is set to VSS by VSSAG 42. For not causing the read-half-select problem, the word-line assist-voltage of WL is set to be some voltage ΔV5 less than VDD by WLAG 43. The double-ended write mode is finished through the help of VDDa lowering. According to various embodiments, in a write mode, the local power-supply assist-voltage VDDa provided to local power-supply assist-voltage node 442 by VDDAG 41 may be some voltage $\Delta V2$ less than VDD. Now, the double-ended write operation is similar to that of a differential 6T SRAM cell using a cell-VDD lowering (CVDDL) (CVDDL)-assist scheme, and will not be described herein again. Before a read operation, BL and BLB may be pre-charged high. VSSa is pulled down to VSS during a double-ended read operation. Word-line WL is asserted to some voltage $\Delta V5$ less than VDD to begin a read operation. Now, the double-ended read mode is similar to that of a differential 6T SRAM cell using a WLUD scheme, and will not be described herein again. According to various embodiments, during a standby mode, the voltage provided to word-line WL by WLAG 43 may be some voltage substantially equal to VSS, the local power-supply assist-voltage VDDa provided to local power-supply assist-voltage node 442 by VDDAG 41 may be substantially equal to VDD, the local source assist-voltage VSSa provided to local source assist-voltage node 452 by VSSAG 42 may be some voltage $\Delta V4$ higher than VSS. According to various embodiments, during a standby mode, the assist-voltage provided to word-line WL by WLAG 43 may be some voltage substantially equal to VSS, the local power-supply assist-voltage VDDa provided to local power-supply assist-voltage node 442 by VDDAG 41 may also be some voltage $\Delta V3$ less than VDD, and the local source assist-voltage VSSa provided to local source assist-voltage node 452 by VSSAG 42 may be some voltage $\Delta V1$ higher than VSS (not shown).

As illustrated in FIG. 4c, FIG. 12a, FIG. 12b, and FIG. 12c, the memory device includes an SRAM cell 40, a VDDAG 41, a VSSAG 42, and a WLAG 43. The SRAM cell 40 can be configured as a differential 6T cell or a GSC 6T cell. As illustrated, the memory device may include an SRAM cell 40 including a local power-supply assist-voltage node 442 for receiving a power-supply assist-voltage VDDa generated by VDDAG 41 and including a third local source assist-voltage node 454 and the fourth local source assist-voltage node 456 for receiving source assist-voltages VSSa1 and VSSa2, respectively, generated by a source assist-voltage generator circuit (VSSAG) 42. As illustrated, the memory device may include an SRAM cell 40. The SRAM cell 40 includes the first word-line WL1 and the second word-line WL2. The first word-line WL1 receives the first word-line assist-voltage generated by the word-line assist-voltage generator circuit (WLAG) 43. The second word-line WL2 receives the second word-line assist-voltage generated by the word-line assist-voltage generator circuit (WLAG) 43.

For various embodiments, VDDAG 41 may include one or more control transistors that, when switched on or off, controls, at least in part, the voltage at local power-supply assist-voltage node 442. For example, VDDAG 41 comprises control transistors 460 and 461. During a read mode or a hold mode, control transistors 460 and 461 may be switched on to drive local power-supply assist-voltage node 442 to a voltage being substantially equal to VDD. Switching of control transistors 460 and 461 may be controlled at least in part by one or more control signals. For example, control transistor 460 may be switched by a standby control signal 'Standby' whereas transistor 461 may be switched by a write-mode or deep sleep control signal 'Write/DeepS.' Although control transistors 460 and 461 are depicted as active low transistors, one or more active high transistors may instead be used, depending on the particular application.

During a write mode, VDDAG 41 may be variously configured for driving local power-supply assist-voltage node 442 to a voltage less than VDD. For the illustrated embodiment, VDDAG 41 may include control transistors 461 and 462, which may be configured to be switched by the write-mode or deep sleep control signal Write/DeepS, where the write-mode or deep sleep control signal results in one of the transistors being switched on and the other switched off. Although control transistor 461 is depicted as an active low transistor and control transistor 462 as an active high transistor, the configuration may be reversed, depending on the application. That is, control transistor 461 may instead be an active high transistor and control transistor 462 may be an active low transistor.

The control transistors 461 and 462 may be configured to switch off and on, respectively, when control signal Write/DeepS is asserted high. Switching control transistors 461 and 462 off and on, respectively, may drive local power-supply assist-voltage node 442 to some voltage less than VDD, due at least in part to the resistance of at least control transistor 462. With respect to control transistor 462 in the illustrated embodiment, switching on control transistor 462 establishes a connection between local power-supply assist-voltage node 442 and the system ground line of VDDAG 41, which may result in the local power-supply assist-voltage node 442 being driven to a reduced voltage with respect to VDD. Reducing the voltage on the local power-supply assist-voltage node 442 may have the effect of decreasing the driving ability of driving transistor 420 and 422, as described herein, thereby increasing the write margin of SRAM cell 40 so that a bit may be written faster and/or more accurately to node Q and/or node QB.

VDDAG 41 may include one or more other control transistors for further selectively controlling the voltage at local power-supply assist-voltage node 442 during a write mode. For example, VDDAG 41 may include one or more other control transistors in addition to control transistors 460 and 461, and one or more of the other control transistors may be included between control transistor 462 and the system ground line of VDDAG 41. For example, illustrated are control transistors 463, 466, and 467, with control transistor 463 disposed between control transistor 462 and the system ground line and with control transistors 466 and 467 disposed between the system power-supply line and local power-supply assist-voltage node 442. In order to switch transistor 466, an inverter 410 constructed by transistors 464 and 465 and controlled by Write/DeepS is added. During a write mode, control signal Write/DeepS is high to drive the output of inverter 410 low to turn on transistor 466. Then, the voltage at local power-supply assist-voltage node 442 is determined, at least in part, by the resistances of control transistors 466, 467, 462, and 463, to be some voltage $\Delta V2$ less than VDD.

In a standby mode, the assist-voltage provided to local power-supply assist-voltage node 442 by VDDAG 41, as described before, may be some voltage $\Delta V3$ less than VDD or be substantially equal to VDD, depending on different design needs. For various embodiments, VDDAG 41 may include one or more control transistors to determine at least in part the voltage at local power-supply assist-voltage node 442. For example, VDDAG 41 additionally includes control transistors 468 and 469, and there are three different setting for control signals Standby and Write/DeepS in a standby mode. First, setting both Standby and Write/DeepS to high, transistors 460 and 466 are switched off and on, respectively, and the assist-voltage at node 442 is determined, at least in part, by the resistances of control transistors 466, 467, 468, 469, 462, and 463. In this case, the assist-voltage at node 442 is about ΔV2 less than VDD. Second, if setting Standby and Write/DeepS to high and low, respectively, both transistors 460 and 466 are switched off, and the assist-voltage at node 442 is determined, at least in part, by the resistances of control transistors 468, 469, 462, and 463. The assist-voltage at node 442 in this case is ΔV3 less than VDD, which is less than that in the previous case. Third, if setting both Standby and Write/DeepS to low, the assist-voltage at node 442 is substantially equal to VDD.

For the first and second settings wherein the power-supply assist-voltage VDDa provided to local power-supply assist-voltage node 442 being some voltage ΔV2 or ΔV3 less than VDD, the effective supply voltage of the SRAM cell in a standby mode is equal to VDD-ΔV2 or VDD-ΔV3 instead of VDD, and the SRAM cell 40 is in a lower-leakage condition no matter if VSSAG 42 provides standby-assist to raise the local source assist-voltage to the third and fourth local source nodes 454 and 456. Now refer to FIG. 4a and FIG. 4b, in any event, with the local power-supply assist-voltage VDDa1 and VDDa2 driven to local power-supply assist-voltage nodes 444 and 446 being some voltage ΔV2 or ΔV3 less than VDD but the power-supply assist-voltage to local power-supply assist-voltage node 442 being substantially equal to VDD, source-to-body junctions of both driving transistors 420 and 422 are reverse biased. Such a reverse-biasing condition may lead to further reduced power consumption due to further reduced current leakage. For the third setting wherein VDDa is equal to VDD, VSSa1 and VSSa2 are some voltage ΔV4 higher than VSS for leakage power reduction. Due to ΔV4, the effective supply voltage of the SRAM cell 40 in a standby mode is equal to VDD-ΔV4 instead of VDD, and the SRAM cell 40 with such a standby-assist is also in an ultra-low-leakage condition.

Turning now to VSSAG 42 in FIG. 4c, FIG. 12a, FIG. 12b, and FIG. 12c, for various embodiments, VSSAG 42 generates local source assist-voltages VSSa1 and VSSa2 for SRAM cell 40. VSSAG 42 may include a first assist voltage generation sub-circuit 421 and a second assist voltage generation sub-circuit 423 for generating local source supply assist-voltages VSSa1 and VSSa2, respectively. For various embodiments, the first assist voltage generation sub-circuit 421 is coupled to the local power-supply assist-voltage node corresponding to the local source supply assist-voltage VSSa1. The second assist voltage generation sub-circuit 423 is coupled to the local power-supply assist-voltage node corresponding to the local source supply assist-voltage VSSa2. For various embodiments, the first assist voltage generation sub-circuit 421 and the second assist voltage generation sub-circuit 423 may be different. However, without loss of generality, the first assist voltage generation sub-circuit 421 is assumed to be the same as the second assist voltage generation sub-circuit 423.

For various embodiments, the first assist voltage generation sub-circuit 421 may include one or more control transistors that, when switched on or off, controls, at least in part, the voltage VDDa1 at local source assist-voltage node 454. For example, the first assist voltage generation sub-circuit 421 includes control transistors 470 and 471. An inverter 436 provides an inverted control signal of Standby, and the other inverter 438 provides an inverted control signal of a first hold-mode control signal Hold1. During a hold mode, the control signals Standby and Hold1 are low and high, respectively, and control transistors 470 and 471 in the first assist voltage generation sub-circuit 421 may be switched on and off, respectively, to drive the third local source assist-voltage node 454 to some voltage ΔV1 higher than VSS due to the voltage-division effect of the leakage path through SRAM cell 40 and transistors 470 and 471. Similarly, during a hold mode, the fourth local source assist-voltage node 456 is also driven to some voltage ΔV1 higher than VSS. Switching of transistors 470 and 471 may be controlled at least in part by one or more control signals. For example, control transistor 470 may be switched by the inverted control signal of Standby whereas control transistor 471 may be switched by the inverted control signal of Hold1. Although control transistors 470 and 471 are depicted as active high transistors, one or more active low transistors may instead be used, depending on the particular application.

During a single-ended read mode, both control signals Standby and Hold1 are asserted low, and control transistors 470 and 471 in the first assist voltage generation sub-circuit 421 may be switched on to drive the third local source assist-voltage node 454 to VSS. However, during a read mode of a GSC 6T cell, the fourth local source assist-voltage node 456 is still maintained at some voltage ΔV1 higher than VSS. On the other hand, during a double-ended read mode of a differential 6T cell, the local source assist-voltage VSSa2 is similarly driven to VSS. Note that during a double-ended read mode of a differential 6T cell, the voltage provided to word-line WL is driven to some voltage ΔV6 less than VDD.

During a write mode with alternate single-ended operations of a GSC 6T cell, control signal Standby is asserted low to switch control transistor 470 on. The first hold-mode control signal Hold1 and the second hold-mode control signal Hold2 are asserted low during the first and the second half-cycle (interval), respectively, of a write mode. Then, control transistor 471 in the first assist voltage generation sub-circuit 421 is switched on to drive the third local source assist-voltage node 454 to VSS during the first half-cycle (interval) of a write mode. The local source assist-voltage VSSa1 at the third local source assist-voltage node 454 will gradually return to some voltage ΔV1 higher than VSS during the second half-cycle (interval) of a write mode. On the contrary, the local source assist-voltage VSSa2 at the fourth local source assist-voltage node 456 is kept at some voltage ΔV1 higher than VSS during the first half-cycle (interval) of a write mode, and driven to VSS during the second half-cycle (interval) of a write mode.

During a double-ended write mode of a differential 6T cell, control signal Standby is asserted low to switch control transistor 470 on, and control signals Hold1 and Hold2 are also asserted low. Therefore, control transistor 471 in the first assist voltage generation sub-circuit 421 is switched on to drive the third local assist-voltage node 454 to VSS, and the local source assist-voltage VSSa2 is similarly driven to VSS. Moreover, during a double-ended write mode of a differential 6T cell, the voltage provided to word-line WL is driven to some voltage ΔV6 less than VDD, and the voltage VDDa is some voltage ΔV7 less than VDD.

The first assist voltage generation sub-circuit 421 and the second assist voltage generation sub-circuit 423 may include one or more other control transistors for further selectively controlling the assist-voltage at the third and fourth local source assist-voltage nodes 454 and 456 during a read/write mode. The first assist voltage generation sub-circuit 421, for example, may include one or more other control transistors in addition to control transistors 470 and 471, and one or more of other control transistors may be included between control transistor 470 and the system ground line. For example, illustrated are control transistors 474 and 475 disposed between control transistor 470 and the system ground line. In a hold, read or write mode, the third local source assist-voltage node 454 is driven to a voltage determined at least in part by the threshold voltage $V_T$, of control transistors 474 and 475 if transistor 471 is switched off, and is driven to VSS if transistor 471 is switched on. For example, in various embodiments, the voltage at the third local source assist-voltage node 454 may be some voltage about $V_T$ if transistor 471 is switched off. In a standby mode, Standby is asserted high, and Hold1 and Hold2 are also asserted high. Therefore, the third local source assist-voltage node 454 is driven to a voltage determined at least in part by the threshold voltage $V_T$, of control transistors 472, 473, 474, and 475. For example, in various embodiments, the assist-voltage at the third local source assist-voltage node 454 may be some voltage $\Delta V4$ or $\Delta V5$ being about $2 \times V_T$ higher than VSS.

Figure 12A:
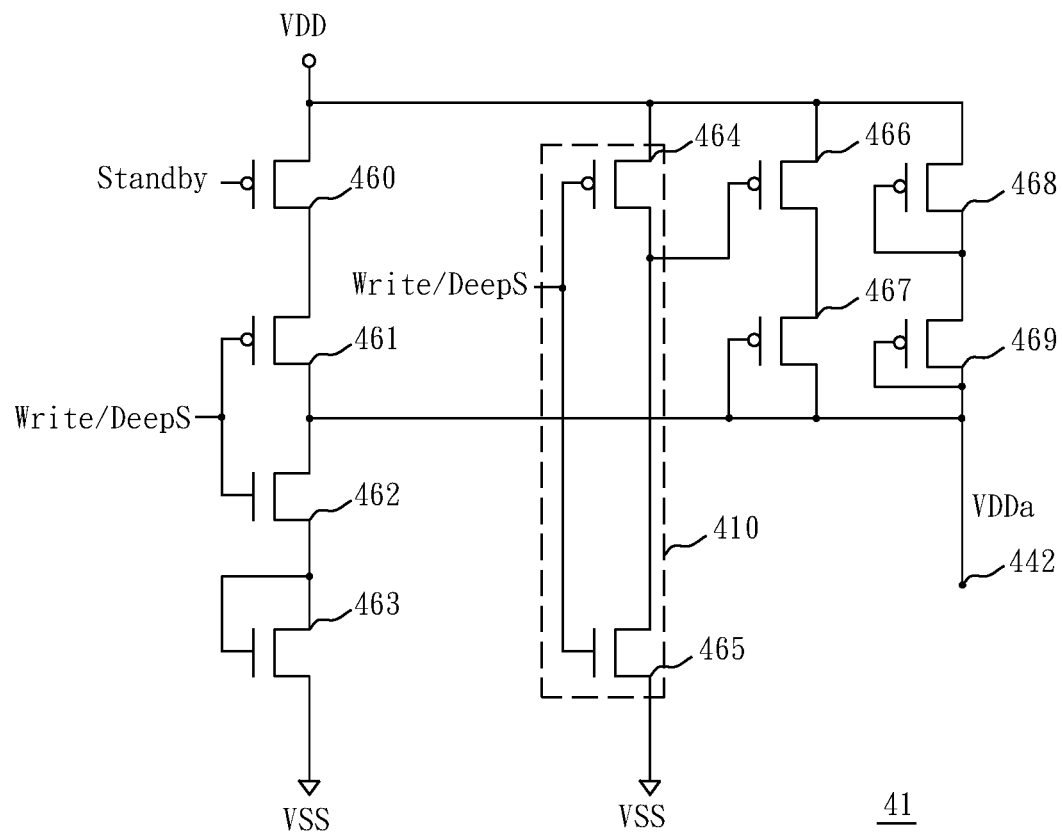
FIG. 12a is a diagram schematically illustrating a power-supply assist-voltage generator circuit according to an embodiment of the present invention.
Figure 12B:
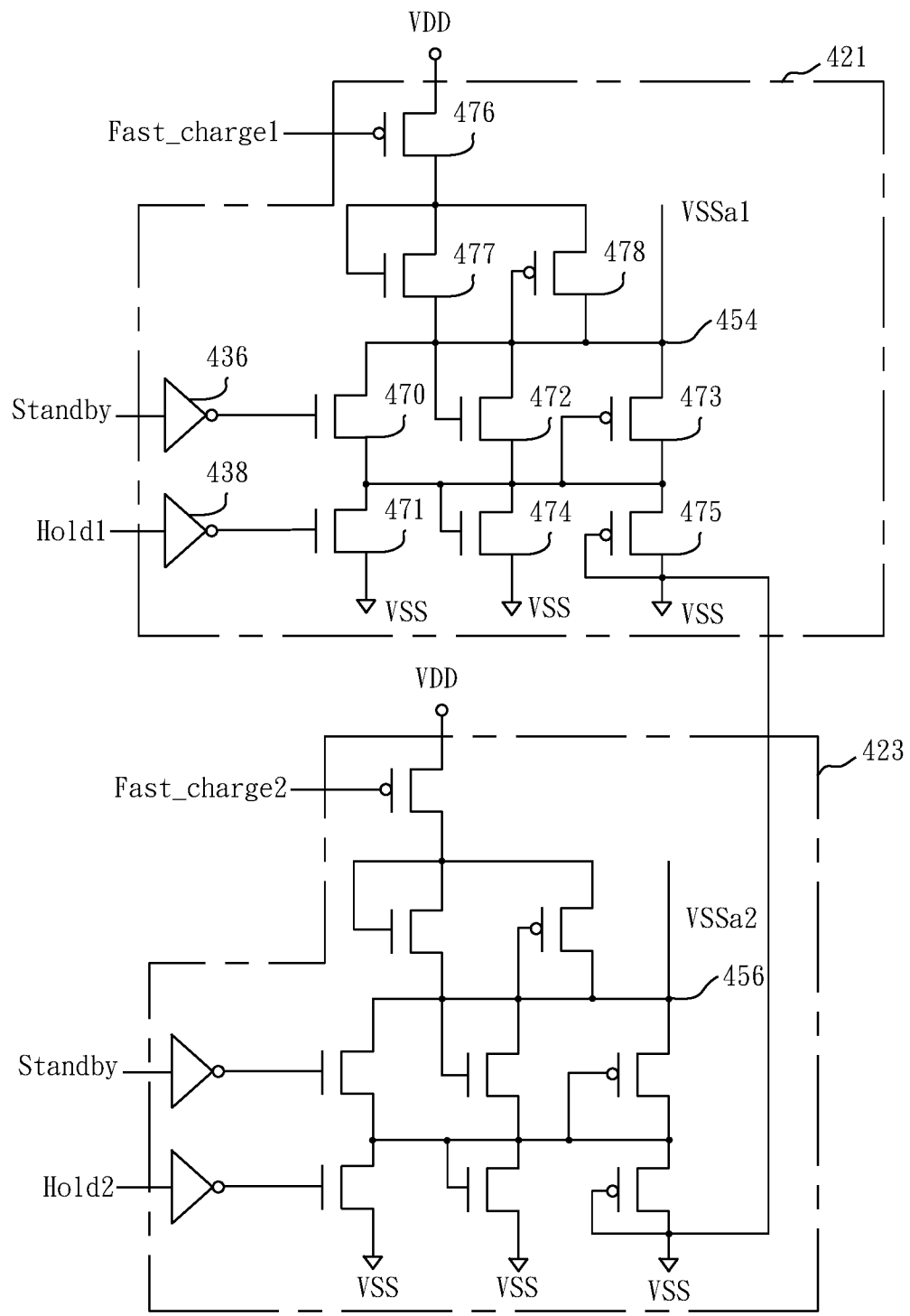
FIG. 12b is a diagram schematically illustrating a source assist-voltage generator circuit according to an embodiment of the present invention.
Figure 13:
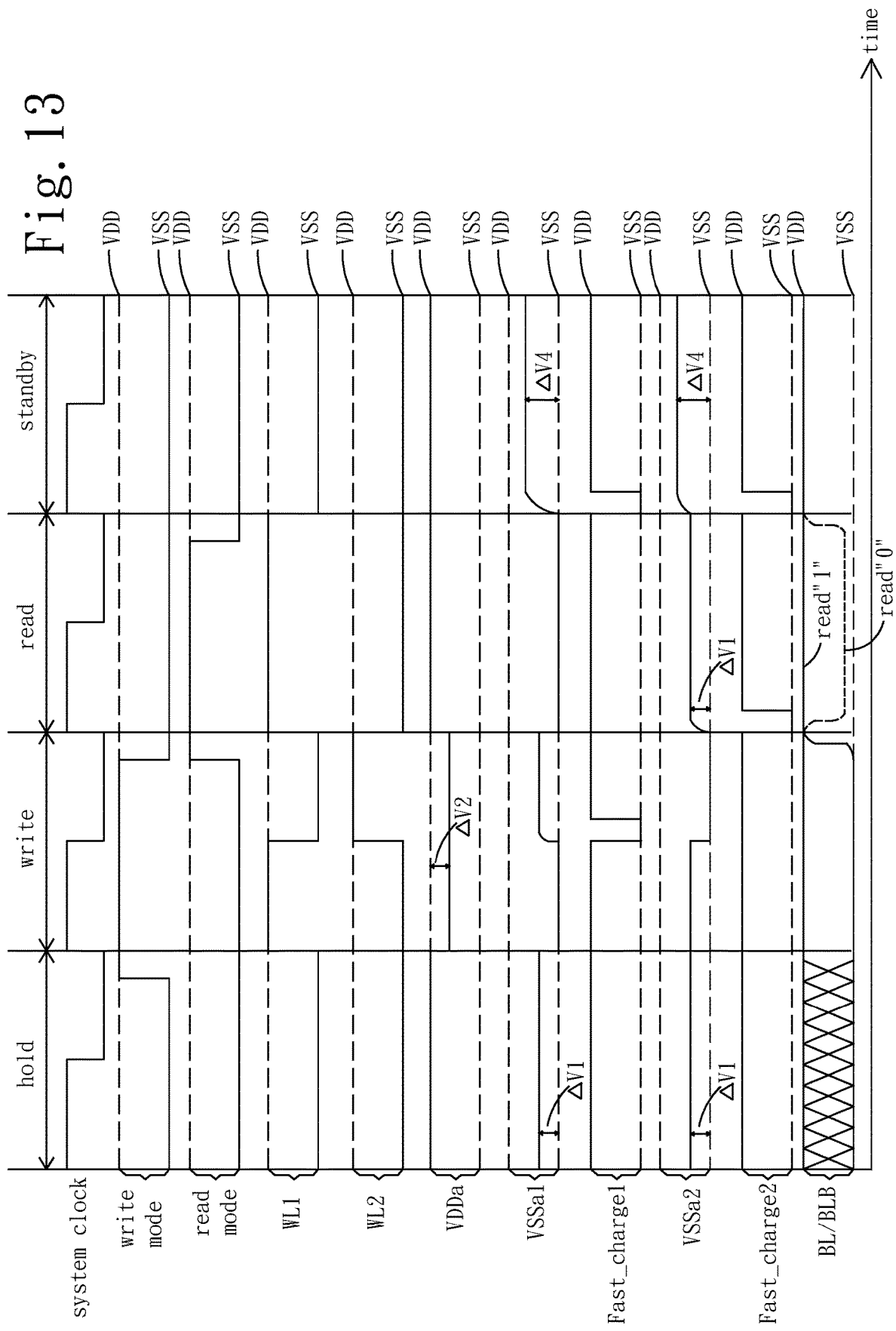
FIG. 13 is a diagram illustrating voltage waveforms of a GSC 6T memory cell in hold, write, read, and standby modes according to an embodiment of the present invention.

The first assist voltage generation sub-circuit 421 and the second assist voltage generation sub-circuit 423 may include one or more other control transistors for further selectively controlling the assist-voltage at the third and fourth local source assist-voltage nodes 454 and 456. The first assist voltage generation sub-circuit 421, for example, may include one or more other control transistors between node 454 and the system power-supply line. Referring to FIG. 12b, for example, illustrated are control transistors 476, 477, and 478 with transistor 476 controlled by control signal Fast_charge1 and transistors 477 and 478 playing as diodes. Let's take the operation of a GSC 6T cell as an example. Referring to FIG. 13, in a hold mode, Fast_charge1 is asserted 'high' to turn off transistor 476 so that transistors 476, 477, and 478 will not interrupt the operation of the other part of the first assist voltage generation sub-circuit 421, and the third local source assist-voltage node 454 is provided with some voltage $\Delta V1$ higher than VSS. Similarly, the fourth local source assist-voltage node 456 is also provided with some voltage $\Delta V1$ higher than VSS. During the first half-cycle of a write mode, VSSa1 is pulled down to VSS, and the first word-line WL1 434 is asserted high. Fast_charge1 is asserted 'high' to turn off transistor 476 so that transistors 476, 477, and 478 will not interrupt the operation of the other part of the first assist voltage generation sub-circuit 421, and the operation is the same as described before. Right after the first half-cycle, Fast_charge1 is asserted 'low' for a short period to turn on transistor 476 so that VSSa1 can be pulled up quickly toward some voltage $\Delta V1$ higher than VSS. After turning off transistor 476 by asserting Fast_charge1 'high' again, VSSa1 will settle at some voltage $\Delta V1$ higher than VSS. During the second half-cycle (interval) of a write mode, VSSa2 is pulled down to VSS, the first word-line WL1 is pulled down to VSS, and the second word-line WL2 is asserted high. Fast_charge2 is asserted 'high' in order not interrupt the operation of the other part of the second assist voltage generation sub-circuit 423, and the operation is the same as described before. Right after the second half-cycle, Fast_charge2 is asserted 'low' for a short period so that VSSa2 can be pulled up quickly toward some voltage $\Delta V1$ higher than VSS. After asserting Fast_charge2 'high' again, VSSa2 will settle at some voltage $\Delta V1$ higher than VSS. During a read mode, VSSa1 is pulled down to VSS, and the first word-line WL1 is asserted high. Fast_charge1 is asserted 'high' in order not interrupt the operation of the other part of the first assist voltage generation sub-circuit 421, and the operation is the same as described before. Right after read operation, Fast_charge1 is asserted 'low' for a short period to turn on transistor 476 so that VSSa1 can be pulled up quickly toward some voltage $\Delta V1$ higher than VSS. After turning off transistor 476 by asserting Fast_charge1 'high' again, VSSa1 will settle at some voltage $\Delta V1$ higher than the system ground voltage VSS. If the SRAM cell enters the standby mode, Fast_charge1 and Fast_charge2 are asserted 'low' for a little longer period in the beginning of the standby operation to pull up VSSa1 and VSSa2 quickly toward some voltage $\Delta V5$ higher than VSS. After asserting Fast_charge1 and Fast_charge2 'high' again, VSSa1 and VSSa2 will settle at some voltage $\Delta V5$ higher than VSS.

Figure 12C:
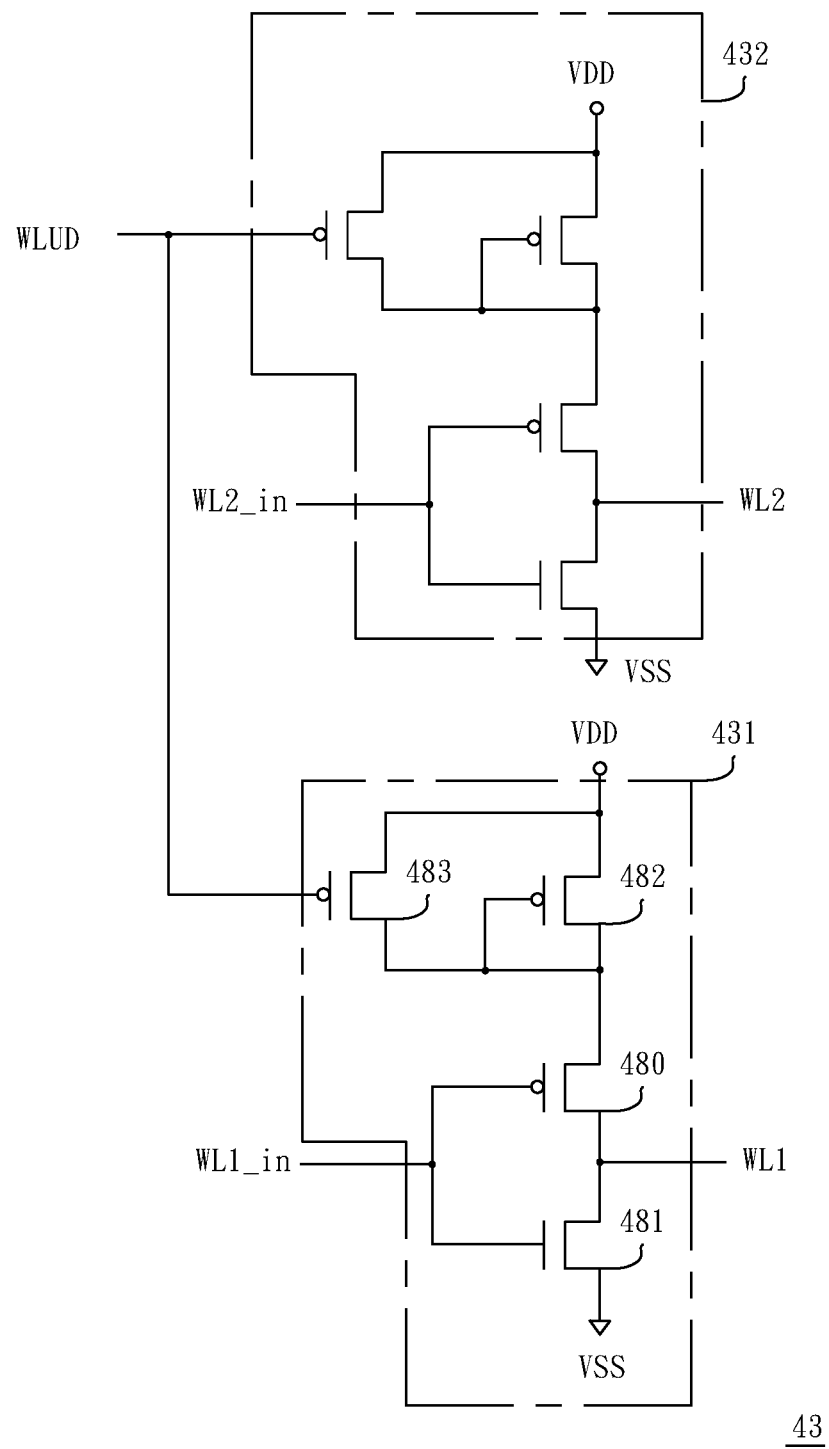
FIG. 12c is a diagram schematically illustrating a word-line assist-voltage generator circuit according to an embodiment of the present invention.

Turning now to WLAG 43 in FIG. 12c, for various embodiments, WLAG 43 generates first and second word-line assist-voltages of the first and second word-lines WL1 and WL2 for SRAM cell 40. SRAM cell 40 may include features similar to those of the exemplary SRAM cell 40.

As illustrated in FIG. 12c, for example, WLAG 43 may include a first word-line assist-voltage generation sub-circuit 431 and a second word-line assist-voltage generation sub-circuit 432 for generating a first word-line assist-voltage and a second word-line assist-voltage, respectively. The first word-line assist-voltage generation sub-circuit 431 is coupled to the first local word-line assist voltage node. The first word-line assist-voltage generation sub-circuit 431 provides assist voltage for the first local word-line assist voltage node. The second word-line assist-voltage generation sub-circuit 432 is coupled to the second local word-line assist voltage node. The second word-line assist-voltage generation sub-circuit 432 provides assist voltage for the second local word-line assist voltage node. For various embodiments, the first word-line assist-voltage generation sub-circuit 431 and the second word-line assist-voltage generation sub-circuit 432 may be different, but without loss of generality, the first word-line assist-voltage generation sub-circuit 431 is assumed the same as the second word-line assist-voltage generation sub-circuit 432 in FIG. 12c.

Let's take the operation of the first word-line assist-voltage generation sub-circuit 431 as an example. A first decoded word-line signal WL1_in is the input signal coming from an address decoder and timing controller (not shown), and a word-line underdrive control signal WLUD is the control signal for helping the generation of word-line assist-voltages. If the SRAM cell 40 is a GSC 6T cell, control signal WLUD is asserted 'low' to turn on transistor 483 so that diode-like transistor 482 will not affect the operation of transistors 480 and 481. Now, the first word-line assist-voltage generation sub-circuit 431 acts as a simple inverter or inverted buffer for providing the first word-line assist-voltage for the first word-line WL1. If the SRAM cell 40 is a differential 6T cell, WLUD is asserted 'high' to turn off transistor 483 so that diode-like transistor 482 will introduce a threshold drop from VDD to the drain node of transistor 482 itself. Now, the first word-line assist-voltage generation sub-circuit 431 acts as an inverter or inverted buffer with a local power-supply voltage being some voltage $\Delta V2$ lower than VDD. In other words, when WL1_in is asserted low, the first word-line assist-voltage of the first word-line will be raised to some voltage $\Delta V2$ lower than VDD. In a standby mode, both the first decoded word-line signal WL1_in and the second decoded word-line signal WL2_in are asserted 'high' so that the first word-line assist-voltage of the first word-line and the second word-line assist-voltage of the second word-line are pulled to some voltage substantially equal to VSS.

Figure 14:
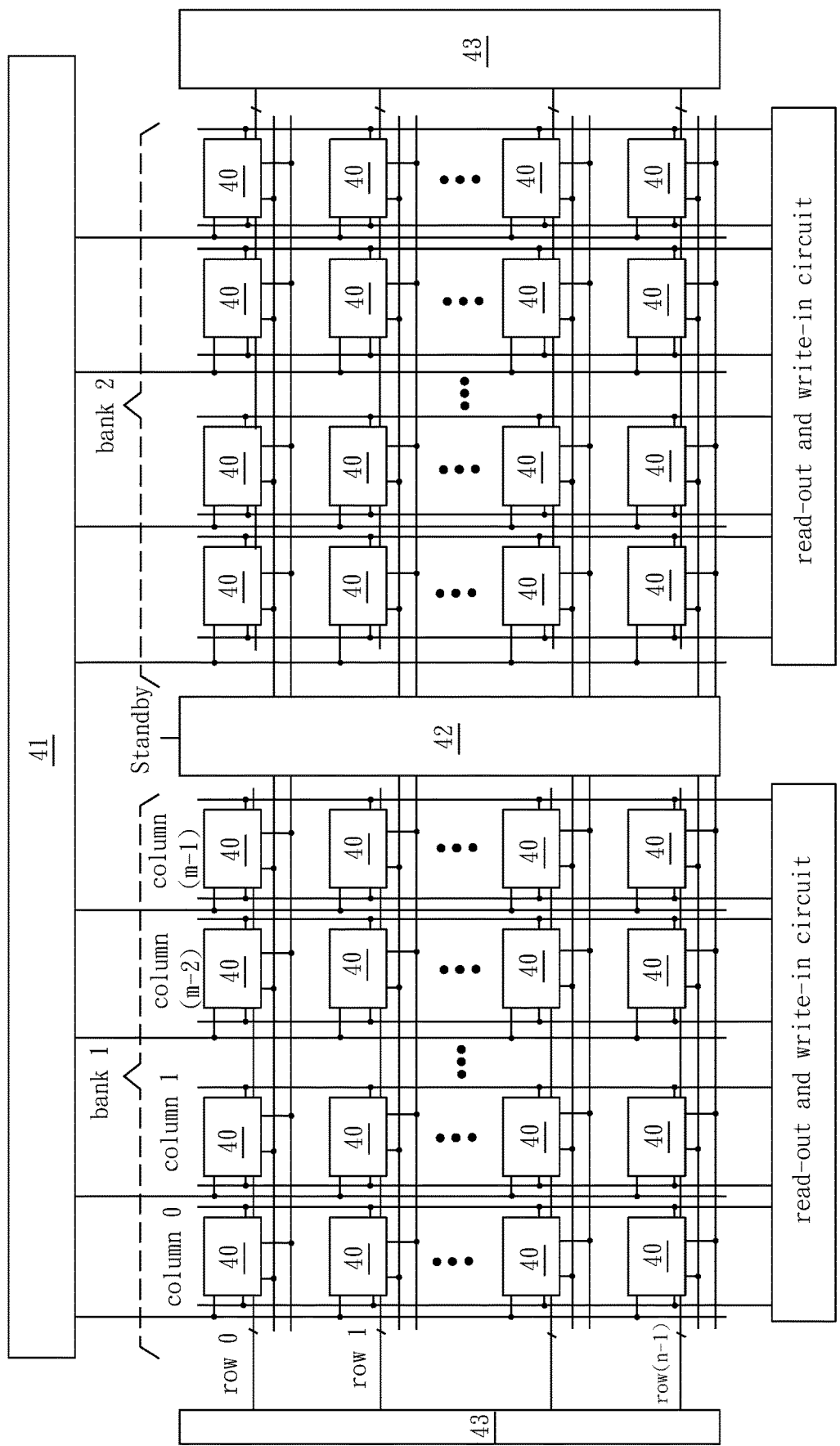
FIG. 14 is a diagram schematically illustrating a memory device according to a sixth embodiment of the present invention

Although FIG. 4a, FIG. 4b, FIG. 4c, and FIG. 4d generally depict a single VDDAG 41 being configured to drive the local power-supply assist-voltage node of one SRAM cell 40 to a selected voltage, VDDAG 41 may, in various embodiments, be configured to drive the local power-supply assist-voltage nodes of two or more SRAM cells to a selected voltage. Furthermore, although FIG. 4a, FIG. 4b, FIG. 4c, and FIG. 4d generally depict a single VSSAG 42 being configured to drive the local source assist-voltage node of one SRAM cell 40 to a selected voltage, VSSAG 42 may, in various embodiments, be configured to drive the local source assist-voltage nodes of two or more SRAM cells to a selected voltage. Lastly, although FIG. 4a, FIG. 4b, FIG. 4c, and FIG. 4d generally depict a single WLAG 43 being configured to drive the local word-line assist-voltage node of one SRAM cell 40 to a selected voltage, WLAG 43 may, in various embodiments, be configured to drive the word-line assist-voltage nodes of two or more SRAM cells to a selected voltage. As illustrated in FIG. 14, for example, a memory device may comprise a VDDAG 41, a VSSAG 42, a WLAG 43, and an array of SRAM cells 40. As in conventional SRAM arrays, a bank of SRAM cells 40 may comprise columns 'column 0' through 'column m-1', and rows 'row 0' through 'row n-1', as shown in bank 1 in FIG. 14. A memory device may comprise many banks of memory cells. A memory device may comprise a VDDAG 41, a VSSAG 42, and many banks of SRAM cells 40 with each bank accompanied with a WLAG 43.

According to various embodiments, VDDAG 41, VSSAG 42, and WLAG 43 may advantageously be disposed externally to SRAM cell 40 so that the chip area at the memory cell level need not be increased. Referring to FIG. 12a, FIG. 12b, and FIG. 12c, for example, VDDAG 41, VSSAG 42, and WLAG 43 may be integral to the SRAM cell array or may instead be external thereto, depending on the application. Accordingly, an increase in the size of the SRAM cell array may be avoided to the extent desired for the application.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:
1. A memory device comprising:
a first transistor configured to receive a system power supply voltage;
a second transistor configured to receive a system ground voltage;
a static random access memory cell, coupled to the first transistor and the second transistor, having a first local power supply assist voltage node, a second local power supply assist voltage node, a third local power supply assist voltage node, a first local source assist voltage node, a second local source assist voltage node, a third local source assist voltage node, a fourth local source assist voltage node, a first local word-line assist voltage node, and a second local word-line assist voltage node, wherein the first local power supply assist voltage node, the second local power supply assist voltage node, and the third local power supply assist voltage node are configured to receive the system power supply voltage, a first power supply assist voltage, or a second power supply assist voltage, and the first power supply assist voltage and the second power supply assist voltage are less than the system power supply voltage and higher than the system ground voltage;
wherein the first local source assist voltage node, the second local source assist voltage node, the third local source assist voltage node, the fourth local source assist voltage node are configured to receive the system ground voltage, a first source assist voltage, or a second source assist voltage, and the first source assist voltage and the second source assist voltage are higher than the system ground voltage and less than the system power supply voltage;
wherein the first local word-line assist voltage node and the second local word-line assist voltage node are configured to receive the system ground voltage, a first word-line assist voltage, or a second word-line assist voltage, the first word-line assist voltage is equal to the system power supply voltage, and the second word-line assist voltage is higher than the system ground voltage and less than the system power supply voltage;
a power-supply assist-voltage generator circuit coupled to the first local power supply assist voltage node, the second local power supply assist voltage node, and the third local power supply assist voltage node, wherein the power-supply assist-voltage generator circuit is configured to receive a standby control signal and a write-mode or deep sleep control signal, and the power-supply assist-voltage generator circuit is configured to generate the second power supply assist voltage at the first local power supply assist voltage node, the second local power supply assist voltage node, and the third local power supply assist voltage node in response to the write-mode or deep sleep control signal in a write mode or deep sleep mode, the power-supply assist-voltage generator circuit is configured to generate the system power supply voltage at the first local power supply assist voltage node in a read mode or a hold mode, and the power-supply assist-voltage generator circuit is configured to generate the system power supply voltage at the second local power supply assist voltage node and the third local power supply assist voltage node in response to the standby control signal and the write-mode or deep sleep control signal in a read mode or a hold mode;
a source assist-voltage generator circuit coupled to the first local source assist voltage node, the second local source assist voltage node, the third local source assist voltage node, and the fourth local source assist voltage node, wherein the source assist-voltage generator circuit is configured to receive the standby control signal, a first hold-mode control signal, and a second hold-mode control signal, the source assist-voltage generator circuit is configured to generate the first source assist voltage at the first local source assist voltage node, the second local source assist voltage node, the third local source assist voltage node, and the fourth local source assist voltage node in response to the standby control signal in a standby mode, the source assist-voltage generator circuit is configured to generate the second source assist voltage at the first local source assist voltage node and the third local source assist voltage node in response to the first hold-mode control signal in a hold mode, the source assist-voltage generator circuit is configured to generate the second source assist voltage at the second local source assist voltage node and the fourth local source assist voltage node in response to the second hold-mode control signal in a hold mode, the source assist-voltage generator circuit is configured to generate the system ground voltage at the first local source assist voltage node and the second local source assist voltage node in a read or write mode, the source assist-voltage generator circuit is configured to generate the system ground voltage at the third local source assist voltage node in response to the standby control signal and the first hold-mode control signal in a read or write mode, and the source assist-voltage generator circuit is configured to generate the system ground voltage at the fourth local source assist voltage node in response to the standby control signal and the second hold-mode control signal in a read or write mode; and a word-line assist-voltage generator circuit coupled to the first local word-line assist voltage node and the second local word-line assist voltage node, wherein the word-line assist-voltage generator circuit is configured to receive a word-line underdrive control signal, a first decoded word-line signal, and a second decoded word-line signal, the word-line assist-voltage generator circuit is configured to generate the first word-line assist voltage at the second local word-line assist voltage node in response to the word-line underdrive control signal or generate the second word-line assist voltage at the second local word-line assist voltage node in response to the second decoded word-line signal in a write mode, the word-line assist-voltage generator circuit is configured to generate the system ground voltage at the first local word-line assist voltage node in response to the word-line underdrive control signal and the first decoded word-line signal in a hold mode or a standby mode, and the word-line assist-voltage generator circuit is configured to generate the system ground voltage at the second local word-line assist voltage node in response to the word-line underdrive control signal and the second decoded word-line signal in a hold mode or a standby mode.

2. The memory device of claim 1, wherein the power-supply assist-voltage generator circuit is configured to generate the system power supply voltage at the first local power supply assist voltage node in response to the standby control signal and the write-mode or deep sleep control signal.

3. The memory device of claim 1, wherein the source assist-voltage generator circuit is configured to generate the system ground voltage at the first local source assist voltage node in response to the standby control signal and the first hold-mode control signal, and the source assist-voltage generator circuit is configured to generate the system ground voltage at the second local source assist voltage node in response to the standby control signal and the second hold-mode control signal.

4. The memory device of claim 1, wherein the power-supply assist-voltage generator circuit is configured to generate the first power supply assist voltage at the first local power supply assist voltage node, the second local power supply assist voltage node, and the third local power supply assist voltage node in response to the standby control signal in a standby mode.

5. The memory device of claim 1, wherein the power-supply assist-voltage generator circuit is configured to generate the system power supply voltage at the first local power supply assist voltage node in a standby mode, and the power-supply assist-voltage generator circuit is configured to generate the system power supply voltage at the second local power supply assist voltage node and the third local power supply assist voltage node in response to the standby control signal and the write-mode or deep sleep control signal in a standby mode.

6. The memory device of claim 5, wherein the power-supply assist-voltage generator circuit is configured to generate the system power supply voltage at the first local power supply assist voltage node in response to the standby control signal and the write-mode or deep sleep control signal.

7. The memory device of claim 1, wherein the static random access memory cell is a double-sided differential 6T memory cell or a generic split-control (GSC) 6T memory cell, the differential 6T memory cell has one power-supply line, one source-voltage line, one word line, and a pair of differential bit lines, and the GSC 6T memory cell has three split-controlled power-supply lines, four split-controlled source voltage lines, two split-controlled word lines, and two split-accessed bit lines.

8. The memory device of claim 1, wherein the first local power supply assist voltage node includes bases of two pull-up P-channel metal-oxide-semiconductor field effect transistors of the static random access memory cell, and the second local power supply assist voltage node and the third local power supply assist voltage node are respectively sources of the pull-up P-channel metal-oxide-semiconductor field effect transistors.

9. The memory device of claim 1, wherein the first local source assist voltage node and the second local source assist voltage node are respectively bases of two pull-down N-channel metal-oxide-semiconductor field effect transistors of the static random access memory cell, and the third local source assist voltage node includes sources of the two pull-down N-channel metal-oxide-semiconductor field effect transistors.

10. The memory device of claim 1, wherein the first local power supply assist voltage node is maintained to receive the system power supply voltage, the second local power supply assist voltage node and third local power supply assist voltage node are coupled to each other, the second local power supply assist voltage node and third local power supply assist voltage node are configured to receive system power supply voltage, the first power supply assist voltage, or the second power supply assist voltage.

11. The memory device of claim 1, wherein the first local power supply assist voltage node, the second local power supply assist voltage node, and the third local power supply assist voltage node are coupled to each other and configured to receive the system power supply voltage, the first power supply assist voltage, or the second power supply assist voltage.

12. The memory device of claim 1, wherein the first local source assist voltage node and the second local source assist voltage node are maintained to receive the system ground voltage, and the third local source assist voltage node and the fourth local source assist voltage node are configured to receive the system ground voltage, the first source assist voltage, or the second source assist voltage.

13. The memory device of claim 1, wherein the static random access memory cell is formed in a deep N-type well, the first local source assist voltage node and the third local source assist voltage node are coupled to each other and configured to receive the system ground voltage, the first source assist voltage, or the second source assist voltage, and the second local source assist voltage node and the fourth local source assist voltage node are coupled to each other and configured to receive the system ground voltage, the first source assist voltage, or the second source assist voltage.

14. The memory device of claim 1, wherein the source assist-voltage generator circuit includes a first assist voltage generation sub-circuit and a second assist voltage generation sub-circuit, the first assist voltage generation sub-circuit is coupled to the first local source assist voltage node and the third local source assist voltage node, the first assist voltage generation sub-circuit provides assist voltage for the first local source assist voltage node and the third local source assist voltage node, the second assist voltage generation sub-circuit is coupled to the second local source assist voltage node and the fourth local source assist voltage node, and the second assist voltage generation sub-circuit provides assist voltage for the second local source assist voltage node and the fourth local source assist voltage node.

15. The memory device of claim 1, wherein the word-line assist-voltage generator circuit includes a first word-line assist-voltage generation sub-circuit and a second word-line assist-voltage generation sub-circuit, the first word-line assist-voltage generation sub-circuit is coupled to the first local word-line assist voltage node, the first word-line assist-voltage generation sub-circuit provides assist voltage for the first local word-line assist voltage node, the second word-line assist-voltage generation sub-circuit is coupled to the second local word-line assist voltage node, and the second word-line assist-voltage generation sub-circuit provides assist voltage for the second local word-line assist voltage node.

16. The memory device of claim 1, wherein the power-supply assist-voltage generator circuit provides a resistive path when receiving the standby control signal and the write-mode or deep sleep control signal.

17. The memory device of claim 1, wherein the source assist-voltage generator circuit provides a resistive path when receiving the standby control signal, the first hold-mode control signal, and the second hold-mode control signal.

18. The memory device of claim 1, wherein the word-line assist-voltage generator circuit provides a resistive path when receiving the word-line underdrive control signal, the first decoded word-line signal, and the second decoded word-line signal.

19. The memory device of claim 13, wherein the power-supply assist-voltage generator circuit includes one or more transistors configured to provide resistive paths to a ground voltage.

20. The memory device of claim 17, wherein the source assist-voltage generator circuit includes one or more transistors configured to provide resistive paths to a ground voltage.

21. The memory device of claim 18, wherein the word-line assist-voltage generator circuit includes one or more transistors configured to provide resistive paths to a ground voltage.

22. The memory device of claim 1, wherein the static random access memory cell is disposed in an integrated circuit chip, and the power-supply assist-voltage generator circuit, the source assist-voltage generator circuit, and the word-line assist-voltage generator circuit are disposed externally to the integrated circuit chip.

23. An operation method applied to the memory device of claim 1, and the operation method comprising:
receiving the system power supply voltage;
receiving the system ground voltage;
receiving the standby control signal and the write-mode or deep sleep control signal, and generating the second power supply assist voltage at the first local power supply assist voltage node, the second local power supply assist voltage node, and the third local power supply assist voltage node in response to the write-mode or deep sleep control signal in a write mode or deep sleep mode;
generating the system power supply voltage at the first local power supply assist voltage node in a read mode or a hold mode, and generating the system power supply voltage at the second local power supply assist voltage node and the third local power supply assist voltage node in response to the standby control signal and the write-mode or deep sleep control signal in a read mode or a hold mode;
receiving the standby control signal, a first hold-mode control signal, and a second hold-mode control signal, and generating the first source assist voltage at the first local source assist voltage node, the second local source assist voltage node, the third local source assist voltage node, and the fourth local source assist voltage node in response to the standby control signal in a standby mode;
generating the second source assist voltage at the first local source assist voltage node and the third local source assist voltage node in response to the first hold-mode control signal in a hold mode, and generating the second source assist voltage at the second local source assist voltage node and the fourth local source assist voltage node in response to the second hold-mode control signal in a hold mode;
generating the system ground voltage at the first local source assist voltage node and the second local source assist voltage node in a read or write mode, generating the system ground voltage at the third local source assist voltage node in response to the standby control signal and the first hold-mode control signal in a read or write mode, and generating the system ground voltage at the fourth local source assist voltage node in response to the standby control signal and the second hold-mode control signal in a read or write mode;
receiving the word-line underdrive control signal, the first decoded word-line signal, and the second decoded word-line signal, and either generating the first word-line assist voltage at the first local word-line assist voltage node in response to the word-line underdrive control signal or generating the second word-line assist voltage at the first local word-line assist voltage node in response to the first decoded word-line signal in a write mode;
generating the first word-line assist voltage at the second local word-line assist voltage node in response to the word-line underdrive control signal or generate the second word-line assist voltage at the second local word-line assist voltage node in response to the second decoded word-line signal in a write mode; and
generating the system ground voltage at the first local word-line assist voltage node in response to the word-line underdrive control signal and the first decoded word-line signal in a hold mode or a standby mode, and generating the system ground voltage at the second local word-line assist voltage node in response to the word-line underdrive control signal and the second decoded word-line signal in a hold mode or a standby mode.

24. A memory device comprising:
a first transistor configured to receive a system power supply voltage;
a second transistor configured to receive a system ground voltage;
a memory array, coupled to the first transistor and the second transistor, comprising static random access memory cells, wherein the static random access memory cell has a first local power supply assist voltage node, a second local power supply assist voltage node, a third local power supply assist voltage node, a first local source assist voltage node, a second local source assist voltage node, a third local source assist voltage node, a fourth local source assist voltage node, a first local word-line assist voltage node, and a second local word-line assist voltage node, wherein the first local power supply assist voltage node, the second local power supply assist voltage node, and the third local power supply assist voltage node are configured to receive the system power supply voltage, a first power supply assist voltage, or a second power supply assist voltage, and the first power supply assist voltage and the second power supply assist voltage are less than the system power supply voltage and higher than the system ground voltage;

wherein the first local source assist voltage node, the second local source assist voltage node, the third local source assist voltage node, the fourth local source assist voltage node are configured to receive the system ground voltage, a first source assist voltage, or a second source assist voltage, and the first source assist voltage and the second source assist voltage are higher than the system ground voltage and less than the system power supply voltage;

wherein the first local word-line assist voltage node and the second local word-line assist voltage node are configured to receive the system ground voltage, a first word-line assist voltage, or a second word-line assist voltage, the first word-line assist voltage is equal to the system power supply voltage, and the second word-line assist voltage is higher than the system ground voltage and less than the system power supply voltage;

a power-supply assist-voltage generator circuit coupled to the first local power supply assist voltage node, the second local power supply assist voltage node, and the third local power supply assist voltage node, wherein the power-supply assist-voltage generator circuit is configured to receive a standby control signal and a write-mode or deep sleep control signal, and the power-supply assist-voltage generator circuit is configured to generate the second power supply assist voltage at the first local power supply assist voltage node, the second local power supply assist voltage node, and the third local power supply assist voltage node in response to the write-mode or deep sleep control signal in a write mode or deep sleep mode, the power-supply assist-voltage generator circuit is configured to generate the system power supply voltage at the first local power supply assist voltage node in a read mode or a hold mode, and the power-supply assist-voltage generator circuit is configured to generate the system power supply voltage at the second local power supply assist voltage node and the third local power supply assist voltage node in response to the standby control signal and the write-mode or deep sleep control signal in a read mode or a hold mode;

a source assist-voltage generator circuit coupled to the first local source assist voltage node, the second local source assist voltage node, the third local source assist voltage node, and the fourth local source assist voltage node, wherein the source assist-voltage generator circuit is configured to receive the standby control signal, a first hold-mode control signal, and a second hold-mode control signal, the source assist-voltage generator circuit is configured to generate the first source assist voltage at the first local source assist voltage node, the second local source assist voltage node, the third local source assist voltage node, and the fourth local source assist voltage node in response to the standby control signal in a standby mode, the source assist-voltage generator circuit is configured to generate the second source assist voltage at the first local source assist voltage node and the third local source assist voltage node in response to the first hold-mode control signal in a hold mode, the source assist-voltage generator circuit is configured to generate the second source assist voltage at the second local source assist voltage node and the fourth local source assist voltage node in response to the second hold-mode control signal in a hold mode, the source assist-voltage generator circuit is configured to generate the system ground voltage at the first local source assist voltage node and the second local source assist voltage node in a read or write mode, the source assist-voltage generator circuit is configured to generate the system ground voltage at the third local source assist voltage node in response to the standby control signal and the first hold-mode control signal in a read or write mode, and the source assist-voltage generator circuit is configured to generate the system ground voltage at the fourth local source assist voltage node in response to the standby control signal and the second hold-mode control signal in a read or write mode; and a word-line assist-voltage generator circuit coupled to the first local word-line assist voltage node and the second local word-line assist voltage node, wherein the word-line assist-voltage generator circuit is configured to receive a word-line underdrive control signal, a first decoded word-line signal, and a second decoded word-line signal, the word-line assist-voltage generator circuit is configured to generate the first word-line assist voltage at the second local word-line assist voltage node in response to the word-line underdrive control signal or generate the second word-line assist voltage at the second local word-line assist voltage node in response to the second decoded word-line signal in a write mode, the word-line assist-voltage generator circuit is configured to generate the system ground voltage at the first local word-line assist voltage node in response to the word-line underdrive control signal and the first decoded word-line signal in a hold mode or a standby mode, and the word-line assist-voltage generator circuit is configured to generate the system ground voltage at the second local word-line assist voltage node in response to the word-line underdrive control signal and the second decoded word-line signal in a hold mode or a standby mode.

25. The memory device of claim 24, wherein the power-supply assist-voltage generator circuit is configured to generate the system power supply voltage at the first local power supply assist voltage node in response to the standby control signal and the write-mode or deep sleep control signal.

26. The memory device of claim 24, wherein the source assist-voltage generator circuit is configured to generate the system ground voltage at the first local source assist voltage node in response to the standby control signal and the first hold-mode control signal, and the source assist-voltage generator circuit is configured to generate the system ground voltage at the second local source assist voltage node in response to the standby control signal and the second hold-mode control signal.

27. The memory device of claim 24, wherein the power-supply assist-voltage generator circuit is configured to generate the first power supply assist voltage at the first local power supply assist voltage node, the second local power supply assist voltage node, and the third local power supply assist voltage node in response to the standby control signal in a standby mode.

28. The memory device of claim 24, wherein the power-supply assist-voltage generator circuit is configured to generate the system power supply voltage at the first local power supply assist voltage node in a standby mode, and the power-supply assist-voltage generator circuit is configured to generate the system power supply voltage at the second local power supply assist voltage node and the third local power supply assist voltage node in response to the standby control signal and the write-mode or deep sleep control signal in a standby mode.

29. The memory device of claim 28, wherein the power-supply assist-voltage generator circuit is configured to generate the system power supply voltage at the first local power supply assist voltage node in response to the standby control signal and the write-mode or deep sleep control signal.

30. The memory device of claim 24, wherein the static random access memory cell is a double-sided differential 6T memory cell or a generic split-control (GSC) 6T memory cell, the differential 6T memory cell has one power-supply line, one source-voltage line, one word line, and a pair of differential bit lines, and the GSC 6T memory cell has three split-controlled power-supply lines, four split-controlled source voltage lines, two split-controlled word lines, and two split-accessed bit lines.

31. The memory device of claim 24, wherein the first local power supply assist voltage node includes bases of two pull-up P-channel metal-oxide-semiconductor field effect transistors of the static random access memory cell, and the second local power supply assist voltage node and the third local power supply assist voltage node are respectively sources of the pull-up P-channel metal-oxide-semiconductor field effect transistors.

32. The memory device of claim 24, wherein the first local source assist voltage node and the second local source assist voltage node are respectively bases of two pull-down N-channel metal-oxide-semiconductor field effect transistors of the static random access memory cell, and the third local source assist voltage node includes sources of the two pull-down N-channel metal-oxide-semiconductor field effect transistors.

33. The memory device of claim 24, wherein the first local power supply assist voltage node is maintained to receive the system power supply voltage, the second local power supply assist voltage node and third local power supply assist voltage node are coupled to each other, the second local power supply assist voltage node and third local power supply assist voltage node are configured to receive system power supply voltage, the first power supply assist voltage, or the second power supply assist voltage.

34. The memory device of claim 24, wherein the first local power supply assist voltage node, the second local power supply assist voltage node, and the third local power supply assist voltage node are coupled to each other and configured to receive the system power supply voltage, the first power supply assist voltage, or the second power supply assist voltage.

35. The memory device of claim 24, wherein the first local source assist voltage node and the second local source assist voltage node are maintained to receive the system ground voltage, and the third local source assist voltage node and the fourth local source assist voltage node are configured to receive the system ground voltage, the first source assist voltage, or the second source assist voltage.

36. The memory device of claim 24, wherein the static random access memory cell is formed in a deep N-type well, the first local source assist voltage node and the third local source assist voltage node are coupled to each other and configured to receive the system ground voltage, the first source assist voltage, or the second source assist voltage, and the second local source assist voltage node and the fourth local source assist voltage node are coupled to each other and configured to receive the system ground voltage, the first source assist voltage, or the second source assist voltage.

37. The memory device of claim 24, wherein the source assist-voltage generator circuit includes a first assist voltage generation sub-circuit and a second assist voltage generation sub-circuit, the first assist voltage generation sub-circuit is coupled to the first local source assist voltage node and the third local source assist voltage node, the first assist voltage generation sub-circuit provides assist voltage for the first local source assist voltage node and the third local source assist voltage node, the second assist voltage generation sub-circuit is coupled to the second local source assist voltage node and the fourth local source assist voltage node, and the second assist voltage generation sub-circuit provides assist voltage for the second local source assist voltage node and the fourth local source assist voltage node.

38. The memory device of claim 24, wherein the word-line assist-voltage generator circuit includes a first word-line assist-voltage generation sub-circuit and a second word-line assist-voltage generation sub-circuit, the first word-line assist-voltage generation sub-circuit is coupled to the first local word-line assist voltage node, the first word-line assist-voltage generation sub-circuit provides assist voltage for the first local word-line assist voltage node, the second word-line assist-voltage generation sub-circuit is coupled to the second local word-line assist voltage node, and the second word-line assist-voltage generation sub-circuit provides assist voltage for the second local word-line assist voltage node.

39. The memory device of claim 24, wherein the power-supply assist-voltage generator circuit provides a resistive path when receiving the standby control signal and the write-mode or deep sleep control signal.

40. The memory device of claim 24, wherein the source assist-voltage generator circuit provides a resistive path when receiving the standby control signal, the first hold-mode control signal, and the second hold-mode control signal.

41. The memory device of claim 24, wherein the word-line assist-voltage generator circuit provides a resistive path when receiving the word-line underdrive control signal, the first decoded word-line signal, and the second decoded word-line signal.

42. The memory device of claim 39, wherein the power-supply assist-voltage generator circuit includes one or more transistors configured to provide resistive paths to a ground voltage.

43. The memory device of claim 40, wherein the source assist-voltage generator circuit includes one or more transistors configured to provide resistive paths to a ground voltage.

44. The memory device of claim 41, wherein the word-line assist-voltage generator circuit includes one or more transistors configured to provide resistive paths to a ground voltage.

45. The memory device of claim 24, wherein the static random access memory cell is disposed in an integrated circuit chip, and the power-supply assist-voltage generator circuit, the source assist-voltage generator circuit, and the word-line assist-voltage generator circuit are disposed externally to the integrated circuit chip.

46. An operation method applied to the memory device of claim 24, and the operation method comprising:
- receiving the system power supply voltage;
- receiving the system ground voltage;
- receiving the standby control signal and the write-mode or deep sleep control signal, and generating the second power supply assist voltage at the first local power supply assist voltage node, the second local power supply assist voltage node, and the third local power supply assist voltage node in response to the write-mode or deep sleep control signal in a write mode or deep sleep mode;
- generating the system power supply voltage at the first local power supply assist voltage node in a read mode or a hold mode, and generating the system power supply voltage at the second local power supply assist voltage node and the third local power supply assist voltage node in response to the standby control signal and the write-mode or deep sleep control signal in a read mode or a hold mode;
- receiving the standby control signal, a first hold-mode control signal, and a second hold-mode control signal, and generating the first source assist voltage at the first local source assist voltage node, the second local source assist voltage node, the third local source assist voltage node, and the fourth local source assist voltage node in response to the standby control signal in a standby mode;
- generating the second source assist voltage at the first local source assist voltage node and the third local source assist voltage node in response to the first hold-mode control signal in a hold mode, and generating the second source assist voltage at the second local source assist voltage node and the fourth local source assist voltage node in response to the second hold-mode control signal in a hold mode;
- generating the system ground voltage at the first local source assist voltage node and the second local source assist voltage node in a read or write mode, generating the system ground voltage at the third local source assist voltage node in response to the standby control signal and the first hold-mode control signal in a read or write mode, and generating the system ground voltage at the fourth local source assist voltage node in response to the standby control signal and the second hold-mode control signal in a read or write mode;
- receiving the word-line underdrive control signal, the first decoded word-line signal, and the second decoded word-line signal, and either generating the first word-line assist voltage at the first local word-line assist voltage node in response to the word-line underdrive control signal or generating the second word-line assist voltage at the first local word-line assist voltage node in response to the first decoded word-line signal in a write mode;
- generating the first word-line assist voltage at the second local word-line assist voltage node in response to the word-line underdrive control signal or generate the second word-line assist voltage at the second local word-line assist voltage node in response to the second decoded word-line signal in a write mode; and
- generating the system ground voltage at the first local word-line assist voltage node in response to the word-line underdrive control signal and the first decoded word-line signal in a hold mode or a standby mode, and generating the system ground voltage at the second local word-line assist voltage node in response to the word-line underdrive control signal and the second decoded word-line signal in a hold mode or a standby mode.

\* \* \* \* \*